US 7,431,475 B2

(12) United States Patent
Hafuka et al.

(10) Patent No.: US 7,431,475 B2
(45) Date of Patent: Oct. 7, 2008

(54) RADIATOR FOR LIGHT EMITTING UNIT, AND BACKLIGHT DEVICE

(75) Inventors: Tabito Hafuka, Tokyo (JP); Hirokazu Shibata, Tokyo (JP)

(73) Assignee: Sony Corporation, Tokyo (JP)

( * ) Notice: Subject to any disclaimer, the term of this patent is extended or adjusted under 35 U.S.C. 154(b) by 196 days.

(21) Appl. No.: 11/187,720

(22) Filed: Jul. 22, 2005

(65) Prior Publication Data

US 2007/0019419 A1    Jan. 25, 2007

(51) Int. Cl.
   *F21V 7/20*     (2006.01)
   *F21V 29/00*    (2006.01)
   *G01D 11/28*    (2006.01)

(52) U.S. Cl. .................. 362/218; 362/264; 362/294; 362/373; 362/345; 362/29; 362/30; 362/225

(58) Field of Classification Search ............... 362/373, 362/612, 614, 294, 218, 264, 29–30, 225 362/345; 257/99; 252/299.61
See application file for complete search history.

(56) References Cited

U.S. PATENT DOCUMENTS

| 7,098,486 B2 * | 8/2006 | Chen ........................... 257/99 |
| 2003/0005584 A1 * | 1/2003 | Komatsu et al. ....... 29/890.032 |

| 2006/0002142 A1 * | 1/2006 | Jeong et al. ................ 362/612 |
| 2006/0203206 A1 * | 9/2006 | Kim ............................. 353/58 |

FOREIGN PATENT DOCUMENTS

WO    WO-2005/028950 A1 *   3/2005

\* cited by examiner

*Primary Examiner*—Sandra L. O'Shea
*Assistant Examiner*—Sean P Gramling
(74) *Attorney, Agent, or Firm*—Wolf, Greenfield & Sacks, P.C.

(57) ABSTRACT

The present invention provides a radiator for a light emitting unit, annexed to the light emitting unit including a multiplicity of light emitting diodes mounted on substantially the same axis line on a first principal surface of a wiring substrate. The radiator includes a radiating plate and a heat pipe. The radiating plate is combined with the wiring substrate, with a first principal surface faced as a faying surface to a second principal surface opposite to the first principal surface of the wiring substrate, and is provided with a heat pipe fitting portion. The heat pipe is mounted into the heat pipe fitting portion of the radiating plate while keeping close contact with the inner wall of the heat pipe fitting portion. The heat generated from the light emitting diode group is transferred to a radiating means through the radiating plate and the heat pipe.

15 Claims, 14 Drawing Sheets

RADIATOR FOR LIGHT EMITTING UNIT, AND BACKLIGHT DEVICE

CROSS REFERENCES TO RELATED APPLICATIONS

The present invention contains subject matter related to Japanese Patent Application JP 2004-136919 filed in the Japanese Patent Office on Apr. 30, 2004, the entire contents of which being incorporated herein by reference.

BACKGROUND OF THE INVENTION

The present invention relates to a backlight device provided, for example, in a transmission type liquid crystal display (LCD) or the like, and to a radiator annexed to the backlight device.

The liquid crystal display is suitable for contriving a larger display screen, a lighter weight, a thinner shape, a lower power consumption and the like, as compared with the cathode ray tube (CRT). Therefore, liquid crystal displays have come to be used for TV sets and various displays, together with, for example, the self-light-emitting type PDPs (Plasma Display Panels) and the like. The liquid crystal display has a liquid crystal panel in which liquid crystals are sealed between two transparent substrates of various sizes, and the orientations of liquid crystal molecules are changed by impressing a voltage so as to change the light transmittance, thereby optically displaying a predetermined picture and the like.

Since the liquid crystal itself is not a light-emitting body, the liquid crystal display is provided with a backlight unit functioning as a light source at, for example, a back surface portion of the liquid crystal panel. The backlight unit includes, for example, a primary light source, a light guide plate, a reflective film, a lens sheet or diffusion film, and the like, and display light is supplied to the whole area of the liquid crystal panel. In the backlight unit, a cold cathode fluorescent lamp (CCFL) having mercury or xenon is sealed in a fluorescent tube has been used as the primary light source; however, there are problems yet to be solved, such as the problem of sufficient fluorescence luminance and life possessed by the cold cathode fluorescent lamp and the problem of the uniformity ratio of illuminance arising from the presence of a low luminance region on the cathode side.

Meanwhile, in a large-sized liquid crystal display, there is generally provided an area litconfiguration backlight device in which a plurality of long cold cathode fluorescent lamps are disposed on the back surface of a diffuser plate and which supplies display light to the liquid crystal panel. Also in such an area litconfiguration backlight device, there is a need to solve the problems of the cold cathode fluorescent lamp mentioned above, and, particularly in a large-type TV set exceeding 40 inches in size, the problems of obtaining a higher luminance and a higher uniformity ratio of illuminance are emphasized.

On the other hand, in the air litconfiguration backlight device, attention has been paid to the LED area litconfiguration backlight in which multiplicities of red, green and blue light emitting diodes (LEDs) are arranged two-dimensionally on the back side of a diffuser film to obtain white light, in place of the above-mentioned cold cathode fluorescent lamp. In the case of such an LED backlight device, a reduction in cost is contrived attendant on a reduction in the cost of LEDs, and a high-luminance picture and the like are displayed on a large-sized liquid crystal display with low power consumption.

SUMMARY OF THE INVENTION

Meanwhile, in the LED backlight device, a multiplicity of LEDs is provided and a large quantity of heat is generated from the LEDs. Since the LED backlight device is combined with the liquid crystal panel so that a closed space portion is formed on the back side of the liquid crystal panel, the heat thus generated is accumulated in the closed space portion, to bring the display to an elevated temperature. In addition, the LED backlight device includes the diffusion plate and the reflective film as above-mentioned, and generation of deformation, denaturing or the like in these optical films due to the elevated temperature leads to degradation of the display accuracy.

In the LED backlight device, therefore, an appropriate radiating section is provided for radiating the heat generated from the LEDs. In the LED backlight device, it may be contemplated to contrive to cope with the need for radiating the generated heat by feeding a cooling airflow by use of a cooling fan, for example. However, the configuration in which the cooling airflow is blown directly to the diffusion film and the reflective film cannot be adopted, since this approach leads to the generation of vibrations or unintentional movements.

Therefore, in the LED backlight device, a radiating structure may be adopted in which the generated heat is transferred from the closed space portion to a heat sink formed of an appropriate thermally conductive member, for example, an aluminum member, to thereby achieve radiation of the generated heat. In the LED backlight device, there are the restrictive conditions that the thermally conductive member should not be disposed directly in the closed space portion because the member would shield the display light, that it is desirable to radiate the head from the closed space portion efficiently and uniformly, that the closed space portion should be connected to the heat sink through the shortest course so as to achieve efficient heat radiation, and the like, and the structure is complicated for fulfilling these conditions. Besides, in the LED backlight device, such phenomena as irregularity in color would be generated in the case where the heat radiation is not performed appropriately and where the liquid crystal panel does not have a uniform temperature distribution over the whole area thereof.

In the LED backlight device, when the heat sink is attached directly to the wiring substrate on which, for example, a multiplicity of LEDs are mounted or to a back plate supporting the wiring substrate, an effective heat radiation can be achieved. In the LED backlight device, however, circuit packages for driving the LEDs or for controlling the lighting and the like are mounted to the back plate. For stable operation of these packages, in the LED backlight device, it may be necessary to provide appropriate bracket members or the like for constituting heat-insulating members, for example, by being interposed between the LED backlight device and the back plate and for contriving isolation from the heat sink. The presence of the bracket members or the like increases the thickness of the LED backlight device and lowers the efficiency of assembling operation or the like.

Thus, there is a need for provision of a radiator of a thin type structure capable of efficiently radiating the heat generated from a multiplicity of light emitting diodes. Also, there is a need for provision of a backlight device in which a multiplicity of light emitting diodes are provided for contriving an enhancement of luminance of a display panel, the heat generated from the light emitting diode group is efficiently radiated to make uniform the temperature distribution over the whole area of the display panel, and a thinner form can be contrived.

According an embodiment of the present invention, there is provided a radiator for a light emitting unit, annexed to the light emitting unit in which a multiplicity of light emitting diodes are mounted on substantially the same axis line on a first principal surface of a wiring substrate. The radiator includes a radiating plate which has a first principal surface combined as a faying surface with a second principal surface opposite to the first principal surface of the wiring substrate and which is provided with a heat pipe fitting recessed portion in a second principal surface opposite to its first principal surface, and a heat pipe mounted in the heat pipe fitting recessed portion while keeping close contact with the inner wall of the heat pipe fitting recessed portion.

The radiator is provided for the light emitting unit which has a multiplicity of light emitting diodes as a light source and which thereby emit light at a high luminance. In the radiator, a large amount of heat is generated by the lighting operations of the light emitting diodes, and the heat thus generated is conducted to the radiating plate formed of a metallic member having good thermal conductivity such as, for example, an aluminum material. In the radiator, besides, the heat pipe having a high heat conduction performance is mounted in the heat pipe fitting recessed portion formed in the radiating plate, whereby the heat is radiated through efficient conduction to a radiating section via the radiating plate and the heat pipe. In the radiator, further, the heat pipe is kept in close contact with the inner wall of the heat pipe fitting recessed portion, so that the conduction of heat from the radiating plate to the heat pipe is performed efficiently, and the heat generated from the light emitting diodes is radiated at the radiating section.

According to another embodiment of the present invention, there is provided a backlight device which is combined with a transmission type display panel, and supplies display light to the display panel from the back side so that appropriate images and the like can be displayed at high luminance. The backlight device includes a backlight unit, a radiating unit, and a back panel. In the backlight device, the backlight unit includes a wiring substrate disposed opposite to the back surface of the display panel, and a multiplicity of light emitting diodes mounted on substantially the same axis line on a principal surface of the wiring substrate. In the backlight device, the radiating unit includes a radiating plate which is combined with the wiring substrate, with its principal surface faced as a faying surface to a second principal surface opposite to the first principal surface of the wiring substrate, and which is provided with a heat pipe fitting recessed portion in its second principal surface opposite to its first principal surface, a heat pipe mounted in the heat pipe fitting recessed portion of the radiating plate while keeping close contact with the inner wall of the heat pipe fitting recessed portion, and a radiating section which is disposed on the side of an outer peripheral portion of the display panel and to which a tip end portion of the heat pipe is connected. In the backlight device, to the back panel is mounted the radiating plate, with a second principal surface opposite to the first principal surface as a mount surface.

In the backlight device, a light emitting diode group having a multiplicity of light emitting diodes provided in the backlight unit is used as a light source, and the light emitting diodes are put into lighting operation to supply a high capacity of display light to the transmission type display panel so that an image and the like can be displayed at high luminance. In the backlight device, a large amount of heat generated as a result of lighting operations of the light emitting diodes and accumulated in a space portion between the backlight unit and the transmission type display panel is efficiently radiated by the radiating unit, whereby the transmission type display panel is illuminated in a stable condition. In the backlight device, the heat generated from the light emitting diodes is efficiently radiated by the radiating unit and the transmission type display panel is brought to a predetermined temperature which prevails substantially uniformly over the whole surface of the display panel, whereby generation of irregularity in color and the like is prevented, and images and the like can be stably displayed at high luminance.

In the backlight device, the heat generated is conducted to the radiating plate formed of a metallic member having good thermal conductivity such as, for example, an aluminum material. In the backlight device, the radiating plate is provided with the heat pipe fitting recessed portion, and the heat pipe having a high heat conduction performance is mounted in the heat pipe fitting recessed portion while keeping close contact with the latter. In the backlight device, the heat generated from the light emitting diode group is radiated by conducting the heat to the radiating section via the radiating plate and the heat pipe.

According to the radiator for a light emitting unit according to one embodiment of the present invention configured as above, the large quantity of heat generated as a result of the light operations of a multiplicity of light emitting diodes is efficiently conducted by the radiating plate and the heat pipe to the radiating section provided at a separate location. Therefore, according to the radiator for a light emitting unit, a light emitting unit which has a multiplicity of light emitting diodes as a light source and which emit light at high luminance through a stable operation can be obtained, without providing a radiating section directly at the light emitting portion. In addition, according to the radiator for a light emitting unit, the heat pipe is mounted in the heat pipe fitting recessed portion formed in the radiating plate in the state of making close contact with the heat pipe fitting recessed portion, so that it is possible to contrive an enhancement of the efficiency of the cooling function and to contrive a reduction in the thickness of the light emitting unit.

Besides, in the backlight device according to another embodiment of the present invention, a high capacity of display light is supplied to the transmission type display panel by the backlight unit having a light emitting diode group composed of a multiplicity of light emitting diodes as a light source, whereby an optical display at high luminance can be achieved. In the backlight device, a highest-efficiency portion of the radiating plate absorbing the large quantity of heat which is generated upon lighting operations of the light emitting diodes and which is accumulated in the space portion between the backlight unit and the transmission type display panel is cooled by the heat pipe having a high-efficiency cooling ability, whereby efficient heat radiation is achieved, and the transmission type display panel is permitted to perform optical display in a stable condition. In the backlight device, the heat pipe is fitted in the heat pipe fitting recessed portion formed in the radiating plate, whereby it is possible to reduce the thickness of the radiating unit having the high radiation performance and to thereby contrive a reduction in the overall thickness of the backlight device. In the backlight device, the transmission type display panel is kept at a substantially uniform temperature over the whole area thereof, whereby generation of irregularity in color and the like is prevented, and a stable display can be achieved.

DETAILED DESCRIPTION OF THE PREFERRED EMBODIMENTS

Figure 1:
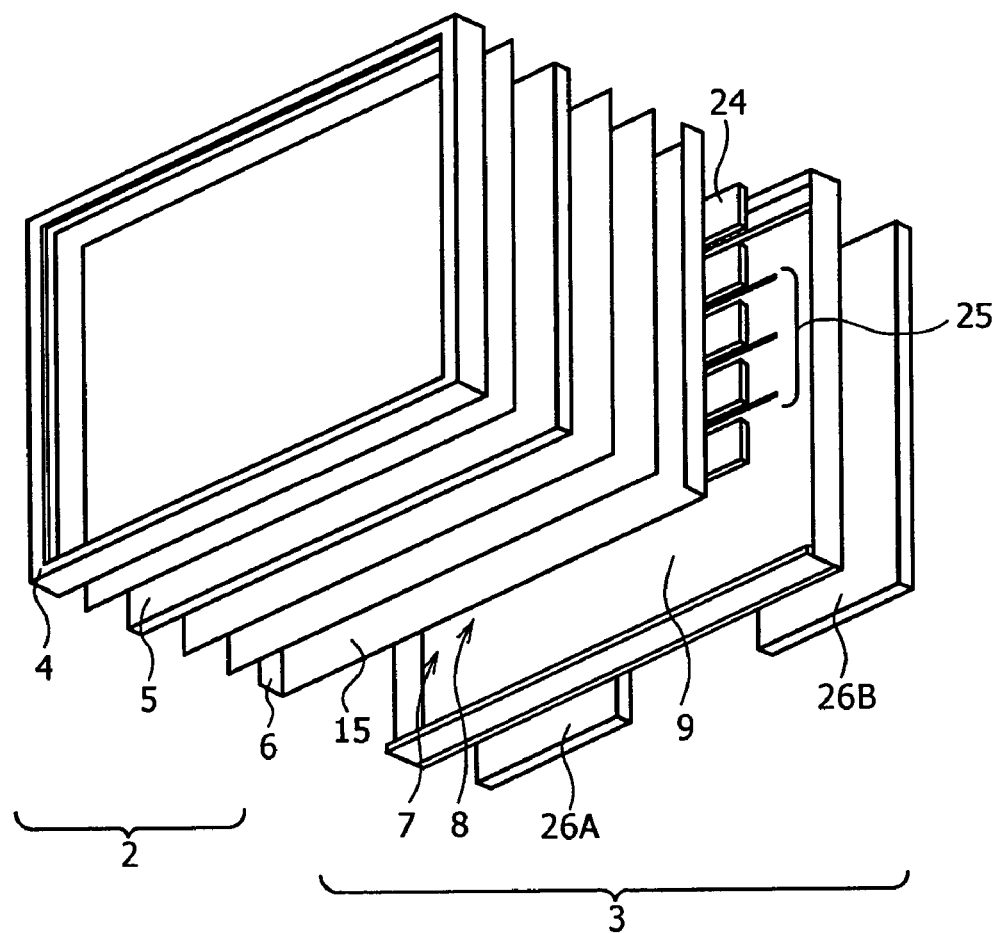
FIG. 1 is an exploded perspective view of a major part of a transmission type liquid crystal display panel according to an embodiment of the present invention.
Figure 2:
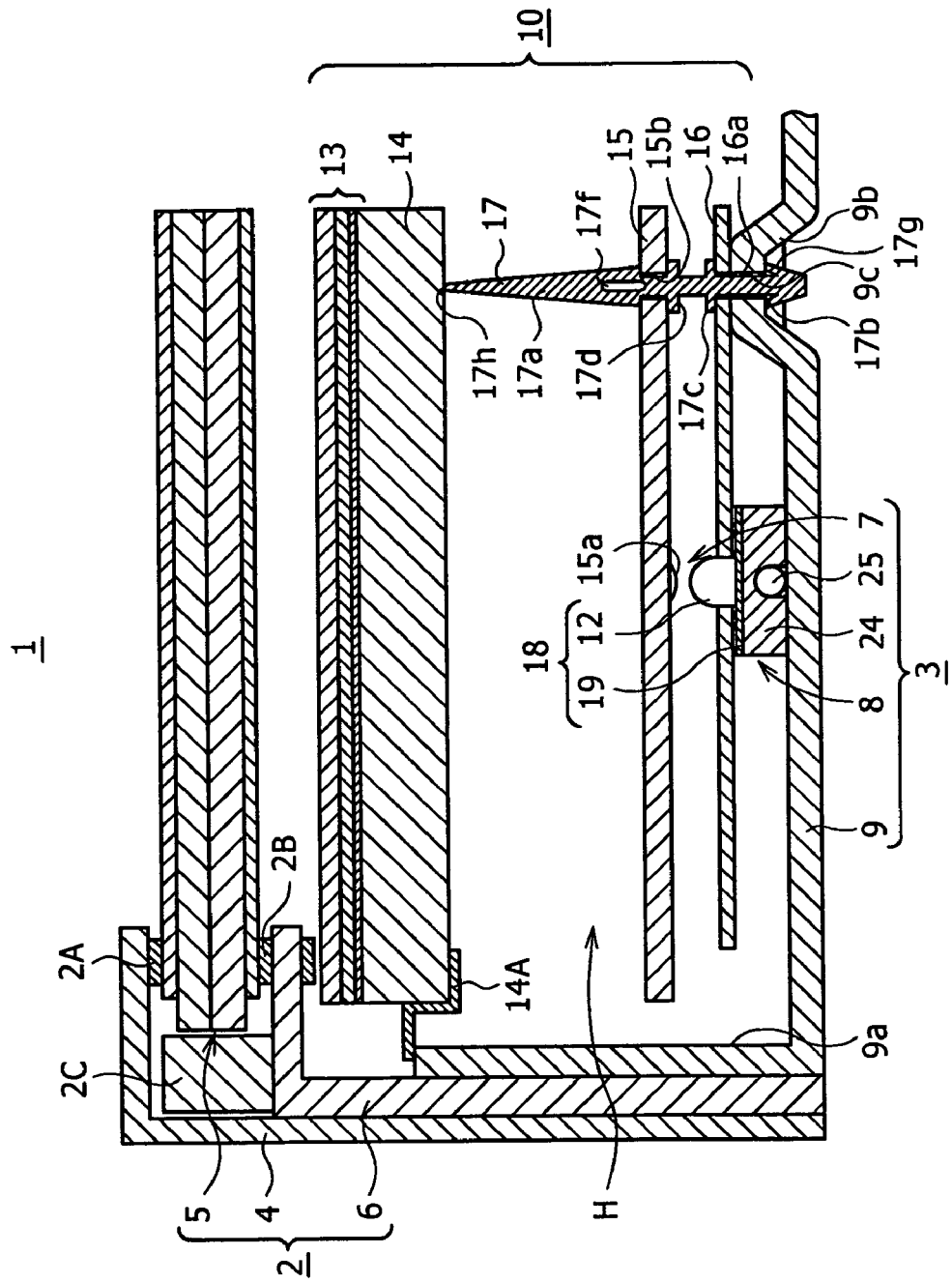
FIG. 2 is a vertical sectional view of a major part of the transmission type liquid crystal display panel.

Now, a transmission type liquid crystal display panel 1 shown in the figures as an embodiment of the present invention will be described in detail below. The transmission type liquid crystal display panel 1 is used as a display panel of a TV set having a large display screen of 40 inches or more, for example. As shown in FIGS. 1 and 2, the transmission type liquid crystal display panel 1 includes a liquid crystal panel unit 2, and a backlight unit 3 combined with the back side of the liquid crystal panel unit 2 for supplying display light to the latter. The liquid crystal panel unit 2 includes a frame-like front frame member 4, a liquid crystal panel 5, and a frame-like back frame member 6 for clamping an outer peripheral portion of the liquid crystal panel 5 between itself and the front frame member 4 through spacers 2A, 2B, a guide member 2C and the like.

Though details are omitted, the liquid crystal panel 5 has a structure in which a liquid crystal is sealed between a first glass substrate and a second glass substrate kept opposed at an interval by spacer beads or the like and a voltage is impressed on the liquid crystal to change the orientations of the liquid crystal molecules, thereby varying the light transmittance. The liquid crystal panel 5 has striped transparent electrodes, an insulation film and an orientation film which are formed on the inside surface of the first glass substrate. The liquid crystal panel 5 has three-primary-color color filters, an overcoat layer, striped transparent electrodes and an orientation film which are formed on the inside surface of the second glass substrate. The liquid crystal panel 5 has a deflection film and a phase difference film joined to the surfaces of the first glass substrate and the second glass substrate.

In the liquid crystal panel 5, the orientation film composed of a polyimide is arranged in the horizontal direction with the liquid crystal molecules as an interface, the deflection film and the phase difference film make the wavelength characteristics achromatic and white, and a color filter functions to contrive a full-color display, thereby achieving color display of received pictures and the like. Incidentally, the liquid crystal panel 5 is not limited to such a structure, and liquid crystal panels of various configurations provided in the past can naturally be adopted.

Figure 14:
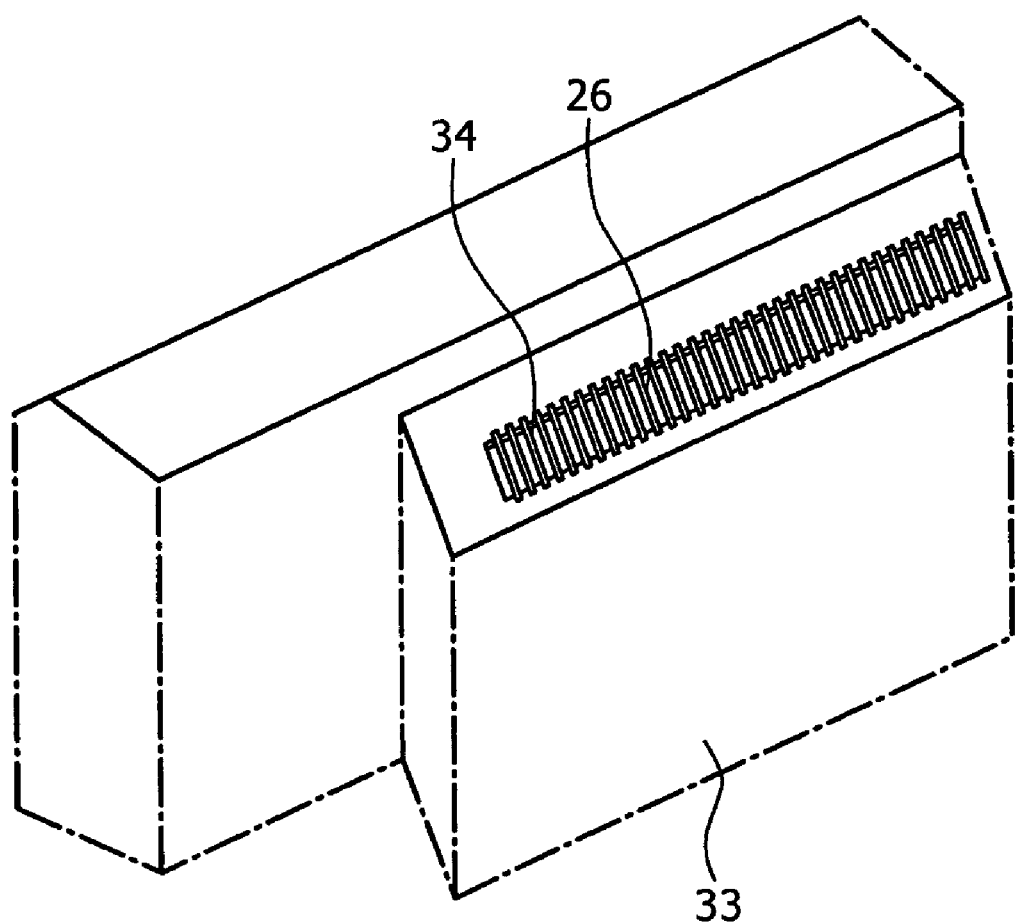
FIG. 14 is a perspective view of a major part of a transmission type liquid crystal display panel utilizing a heat sink as an armor member.

The backlight unit 3 includes a light emitting unit 7 disposed on the back side of the above-mentioned liquid crystal panel unit 2 so as to supply display light, a radiating unit 8 for radiating the heat generated in the light emitting unit 7, and a back panel 9 which holds the light emitting unit 7 and the radiating unit 8 and which is combined with the front frame member 4 and the back frame member 6 to constitute a mount member for mounting to a casing 33 (see FIG. 14). The backlight unit 3 has such an outer size as to face the back surface of the liquid crystal panel unit 2 over the whole area of the back surface, and both the units are combined in the condition where the opposed space portion is optically closed.

The backlight unit 3 has the light emitting unit 7 composed of an optical sheet block 10 and a light emitting block 11 having a multiplicity of light emitting diodes (hereinafter referred to as LEDs) 12. The optical sheet block 10 is disposed opposite to the back side of the liquid crystal panel 5; though details are omitted, the optical sheet block 10 includes an optical sheet laminate 13 formed by laminating various optically functional sheets such as prism sheet and diffusion film, a diffusion light guide plate 14 or a diffusion plate 15, a reflective sheet 16 and the like. Though details are omitted, the optical sheet laminate 13 is configured by laminating a plurality of optically functional sheets such as a functional sheet for decomposing the display light supplied from the light emitting unit 11 and incident on the liquid crystal panel 5 into orthogonal polarized light components, a functional sheet for compensating for the light wave phase difference to contrive a widening of angle of visibility and prevention of coloration, a functional sheet for diffusing the display light, etc. Incidentally, the optical sheet laminate 13 is not limited to the laminates of the just-mentioned optically functional sheets, and may include a luminance enhancing film for contriving enhancement of luminance, two upper and lower diffusion films for sandwiching the phase difference film or the prism sheet therebetween, etc.

The optical sheet block 10 has a structure in which the diffusion light guide plate 14 is disposed on the side of a principal surface, opposite to the liquid crystal panel 5, of the optical sheet laminate 13, and the display light supplied from the light emitting block 11 is incident thereon from the back side. The diffusion light guide plate 14 is composed of a little thick plate body formed of a light-guiding transparent synthetic resin material, for example, acrylic resin, polycarbonate resin or the like. The diffusion light guide plate 14 guides the display light incident thereon from one principal surface side while diffusing the light through refraction and reflection in the inside thereof, and causes the light to go out therefrom through its other principal surface for being incident on the optical sheet laminate 13. The diffusion light guide plate 14 is laminated on the optical sheet laminate 13 as shown in FIG. 2, and is mounted to an outer peripheral wall portion 9a of the back panel 9 through bracket members 14A.

The optical sheet block 10 has a structure in which the diffusion plate 15 and the reflective sheet 16 are mounted to the back panel 9 in the condition where their mutual interval and the interval between them and the diffusion light guide plate 14 are held by a multiplicity of optical stud members 17. The diffusion plate 15 is a plate member which is formed of a milky white light-guiding synthetic resin material, for example, an acrylic resin, and on which the display light supplied from the light emitting block 11 is incident. The diffusion plate 15 is provided with a multiplicity of dimmer dots 15a arrayed opposite respectively to the multiplicity of LEDs 12 of the light emitting block 11 which are arrayed as will be detailed later.

In the diffusion plate 15, the dimmer dots 15a are formed by printing them in circular dot patterns on the plate surface by screen printing or the like, using an ink prepared by mixing a light-shielding agent such as titanium oxide and barium sulfate and a diffusing agent such as glass powder and silicon oxide. The display light supplied from the light emitting block 11 is incident on the diffusion plate 15 through light shielding by the dimmer dots 15a. The diffusion plate 15 diffuses the incident display light in the inside thereof, before the light goes out toward the diffusion light guide plate 14. The diffusion plate 15 is provided with the dimmer dots 15a opposite to the LEDs 12, so as to suppress the partial increase of luminance due to direct incidence of the display light from the LEDs 12, thereby making uniformer the incident light, before the light goes out toward the optical sheet laminate 13.

In the optical sheet block 10, as has been described above, the display light emitted from the LEDs 12 is radiated to the surroundings, whereby partial increase of luminance due to direct incidence of the display light on the diffusion light guide plate 14 is prevented. In the optical sheet block 10, the display light radiated to the surroundings is reflected by the reflective sheet 16 to the side of the diffusion light guide plate 14, whereby enhancement of optical efficiency is contrived. The reflective sheet 16 is formed of a foamable PET (polyethylene terephthalate) containing a fluorescent agent, for example. The foamable PET material is characterized in that it has a high reflectance characteristic of about 95% and a tone different from a metallic luster color and that flaws on the reflective surface are inconspicuous. Incidentally, the reflective sheet 16 may also be formed of silver, aluminum, stainless steel or the like having a mirror finished surface, for example.

The optical sheet block 10 is so configured that when a part of the display light outgoing from the LEDs 12 is incident on the diffusion plate 15 at an angle in excess of a critical angle, the light is reflected on the surface of the diffusion plate 15. The optical sheet block 10 is so configured that the light reflected from the surface of the diffusion plate 15 and a part of the display light radiated from the LEDs 12 to the surroundings and reflected by the reflective sheet 16 are repeatedly reflected between the diffusion plate 15 and the reflective sheet 16, whereby enhancement of reflectance due to the increased reflection principle is contrived.

In the optical sheet block 10, the multiplicity of the optical stud members 17 are provided, whereby the parallelism between the opposed principal surfaces of the diffusion plate 15 and the reflective sheet 16 is accurately maintained over the whole area and the parallelism between the opposed principal surfaces of the diffusion plate 15 and the diffusion light guide plate 14 is accurately maintained over the whole area. The optical stud members 17 are members integrally formed of a milkey white synthetic resin material having a light guiding property and a mechanical rigidity and a certain degree of elasticity, for example, a polycarbonate resin, and are mounted respectively to mount portions 9a which are integrally formed on the back panel 9 as shown in FIGS. 2 and 5.

The back panel 9 is provided with a multiplicity of mount portions 9b integrally formed in a roughly trapezoidal projected shape on the inner surface side. In the back panel 9, the upper surfaces of the mount portions 9b constitute mount surfaces for the diffusion plate 15, and mount holes 9c penetrate through the mount portions 9b, respectively. In the optical sheet block 10, the diffusion plate 15 and the reflective sheet 16 are combined with the back panel 9 while being positioned on a first principal surface 9d of the back panel 9 through the optical stud members 17. The diffusion plate 15 and the reflective sheet 16 are provided with multiplicities of mount holes 15b and 16a corresponding to the mount holes 9c provided in the mount portions 9b of the back panel 9.

Figure 5:
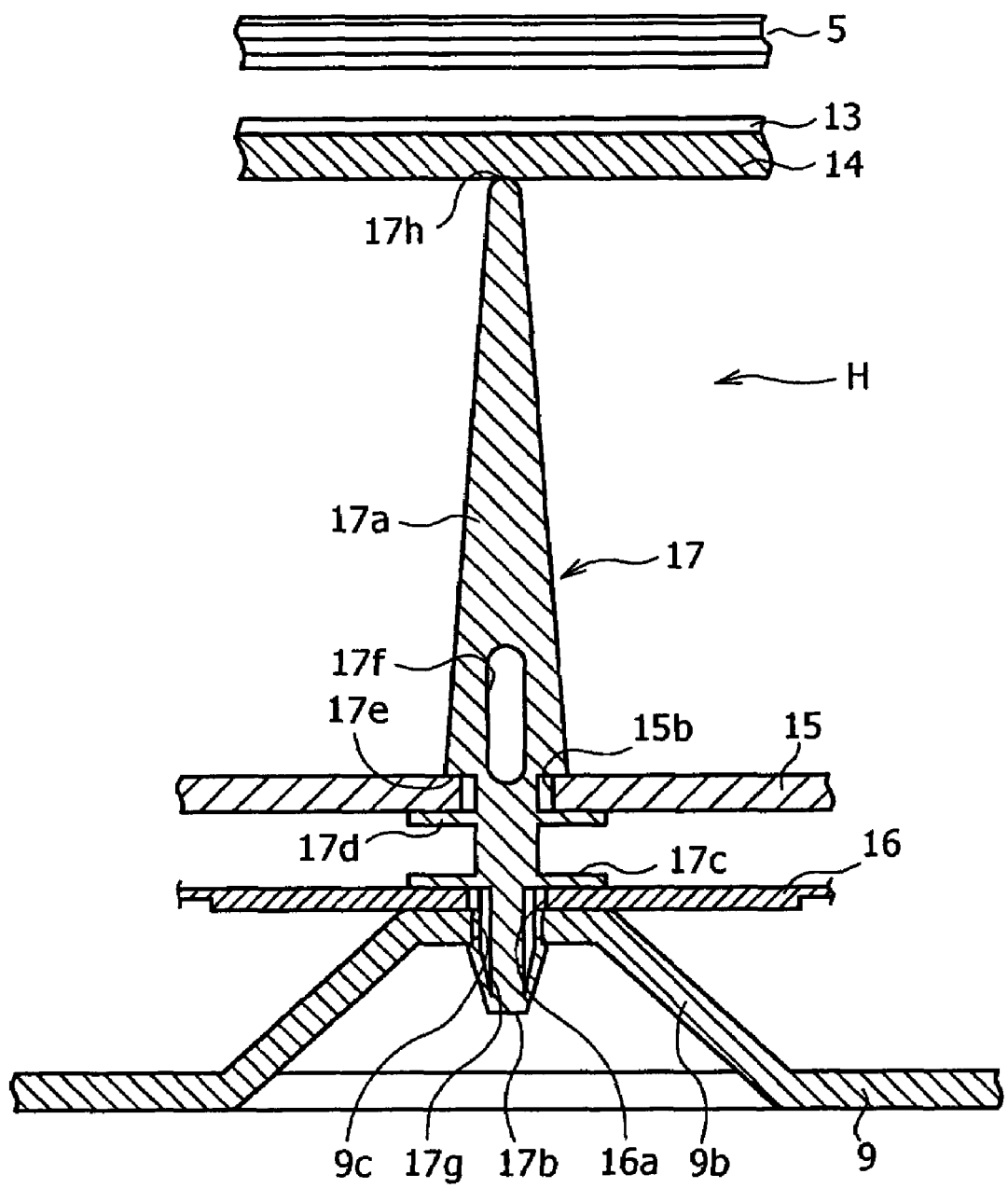
FIG. 5 is a vertical sectional view of a major part of an optical sheet block including an optical stud member.

As shown in FIG. 5, each of the optical stud members 17 is composed of a shaft-like base portion 17a, a mount portion 17b formed at a tip end portion of the shaft-like base portion 17a, a flange-like first receiving plate portion 17c integrally formed around the periphery of the shaft-like base portion 17a at a predetermined distance from the mount portion 17b, and a flange-like second receiving plate portion 17d integrally formed around the periphery of the shaft-like base portion 17a at a predetermined distance from the first receiving plate portion 17c. In each optical stud member 17, the shaft-like base portion 17a is formed with an axial length which determines the interval between the mount portion 9b of the back panel 9 and the diffusion light guide plate 14, and a step portion 17e is provided at a predetermined height from the second receiving plate portion 17d.

In each optical stud member 17, the shaft-like base portion 17a is formed in an axially elongate conical shape gradually reduced in diameter toward the tip end portion from the step portion 17e, which is greater in diameter than the mount hole 15b of the diffusion plate 15. In each optical stud member 17, the shaft-like base portion 17a is provided with an axial lightening hole 17f at a position slightly above the step portion 17e. The lightening hole 17f is formed in the shaft-like base portion 17a within the range of the portion the outside diameter of which is greater than the diameter of the mount hole 15b of the diffusion plate 15, to thereby impart a converging tendency to the portion.

In each optical stud member 17, the first receiving plate portion 17c and the second receiving plate portion 17d are provided at such an interval as to hold the opposed spacing between the diffusion plate 15 and the reflective sheet 16. In each optical stud member 17, the portions, corresponding to the first receiving plate portion 17c and the second receiving plate portion 17d, of the shaft-like base portion 17a are formed to be roughly equal in diameter to the mount hole 15b of the diffusion plate 15. In each optical stud member 17, the mount portion 17b is sagittate in section so that the outside diameter of a tip end portion thereof is roughly equal to the diameter of the mount hole 9c of the back panel 9 and the diameter thereof is gradually increased along the axial direction to be greater than the diameter of the mount hole 9c. In each optical stud member 17, the mount portion 17b is provided with a slot 17g extending from the large-diameter portion toward the tip end side, to acquire a converging tendency.

In the optical stud member 17, the interval between the large-diameter portion and the first receiving plate portion 17c of the mount portion 17b is roughly equal to the thickness of the back panel 9 and the thickness of the diffusion plate 15. In the optical stud member 17, the first receiving plate portion 17c is greater in diameter than the mount hole 15b of the diffusion plate 15, and the second receiving plate portion 17d is larger in diameter than the mount hole 16a of the reflective sheet 16.

In the optical sheet block 10, the reflective sheet 16 is combined onto the mount portion 9b of the back panel 9, with the mount hole 9c and the mount hole 16a disposed opposite to each other. In the optical sheet block 10, the mount portion 17b of each optical stud member 17 is pushed into the mount hole 16a of the reflective sheet 16 from the side of the first principal surface 9d of the back panel 9. In the optical sheet block 10, the mount portion 17b converges under the action of the slot 17g, penetrates through the mount hole 9c on the back panel 9 side, and then returned into a natural state, whereby each optical stud member 17 is prevented from slipping off and is mounted in an erected state on the mount portion 9b.

In the optical sheet block 10, as shown in FIG. 5, each optical stud member 17 clamps the mount portion 9b and the reflective sheet 16 in the thickness direction between its mount portion 17b and its first receiving plate portion 17c, thereby holding the reflective sheet 16 in the state of being positioned relative to the back panel 9. In the optical sheet block 10, each optical stud member 17 is erected on the mount portion 9b of the back panel 9 in the condition where the portion, on the upper side from the first receiving plate portion 17c, of the shaft-like base portion 17a is projected from the reflective sheet 16.

In the optical sheet block 10, the diffusion plate 15 is combined with the optical stud member 17, with the mount holes 15b respectively fitted over the corresponding tip end portions 17h. In the optical sheet block 10, each optical stud member 17 has the large-diameter portion converging under the action of the lightening hole 17f, whereby the diffusion plate 15 is pushed in along the axial direction. In the optical sheet block 10, the diffusion plate 15 rides over the step portion 17e of each optical stud member 17 to abut on the second receiving plate portion 17d of each optical stud member 17, thereby being clamped between the step portion 17e and the second receiving plate portion 17d of each optical stud member 17.

Figure 4:
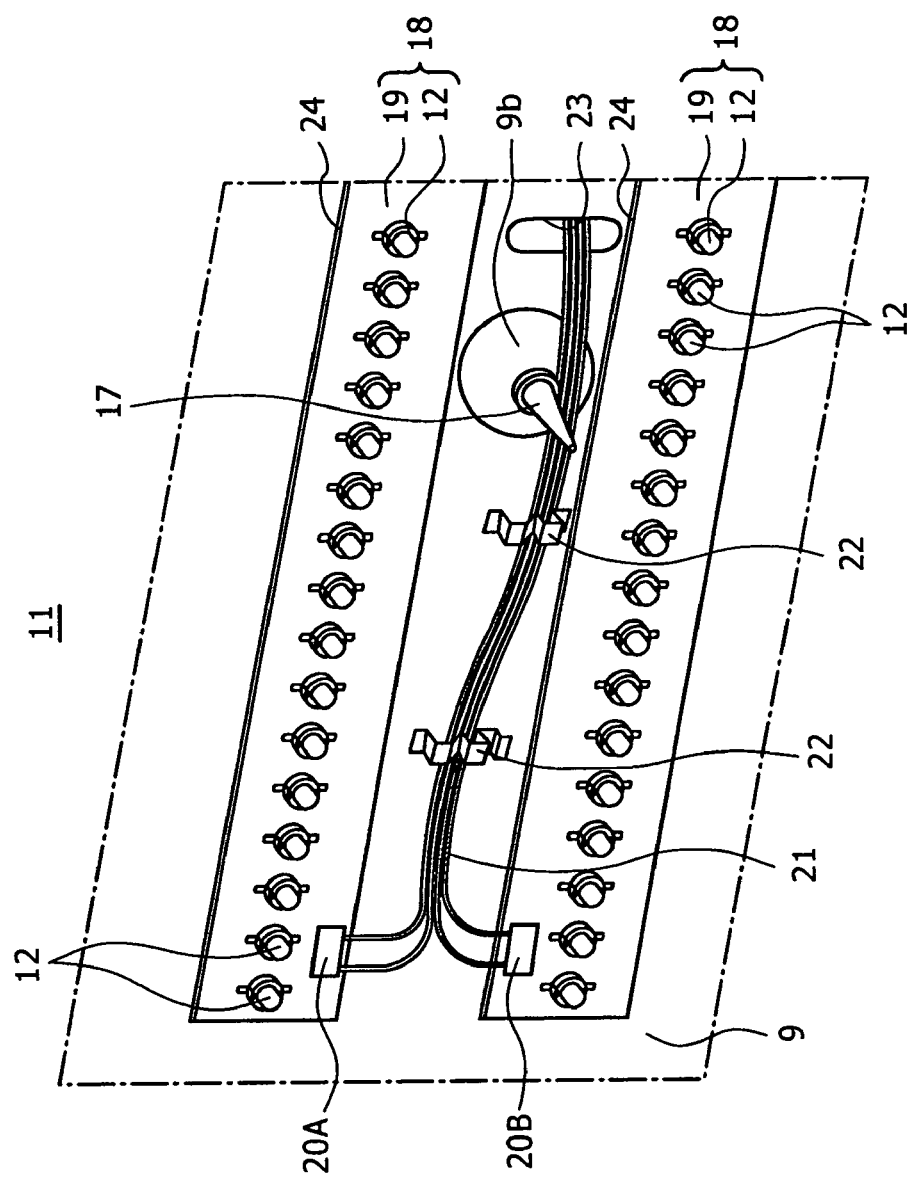
FIG. 4 is a perspective view of a major part of a light emitting block.

In the optical sheet block 10, as shown in FIGS. 4 and 5, the portion, on the upper side from the second receiving plate portion 17d, of the shaft-like base portion 17a of each optical stud member 17 is projected from the diffusion plate 15. In the optical sheet block 10, the diffusion light guide plate 14 having the optical sheet laminate 13 laminated is mounted on the tip end portion 17h of each optical stud member 17, with its bottom surface side abutted on the tip end portion 17h.

In the optical sheet block 10 configured as above, the multiplicity of optical stud members 17 mounted on the first principal surface 9d of the back panel 9 by the simple method of pushing the mount portions 17b into the mount holes 9c position the diffusion plate 15 and the reflective sheet 16, and function to precisely maintain the opposed spacing between the diffusion plate 15 and the reflective sheet 16 and the opposed spacing between the diffusion light guide plate 14 and the optical sheet laminate 13. In the optical sheet block 10, since the above-mentioned plurality of optical stud members 17 are provided, the need for a complicated positioning structure or spacing maintaining structure is eliminated, and simplification of the assembling process can be contrived. The optical stud members 17 can be compatibly used for liquid crystal panels 5 of various sizes, and use of component parts in common can be contrived.

Incidentally, the optical stud members 17 are not limited to the above-mentioned structure, and specific structures of portions thereof may be appropriately modified based on the configuration of the optical sheet block 10. While the optical stud member 17 has been so configured that, for example, the mount portion 17b is provided with a converging tendency by providing the slot 17g and is mounted by pushing into the mount hole 9c of the back panel 9, a configuration may be adopted in which, for example, the optical stud member 17 is integrally provided with an anti-slip-off projected portion at an outer peripheral portion thereof, is fitted into a mount hole 9c provided with a key groove at an inner peripheral portion thereof, and is rotated, so as to be prevented from slipping off.

In the optical sheet block 10, each member is precisely positioned, whereby the operations of guiding, diffusing, reflecting and the like processing of the display light are stably conducted in a light guide space portion H configured between the diffusion light guide plate 14 and the reflective sheet 16, so that generation of irregularity of color or the like in the liquid crystal panel 5 is restrained. In the optical sheet block 10, each optical stud member 17 provided in the light guide space portion H is formed of a milky white light-guiding synthetic resin material and diffuses the display light incident on the inside thereof from the outer peripheral surface thereof so as to prevent its tip end portion 17h from partly displaying luminance, whereby the display light is uniformly incident on the diffusion light guide plate 14 from the light guide space portion H.

Figure 3:
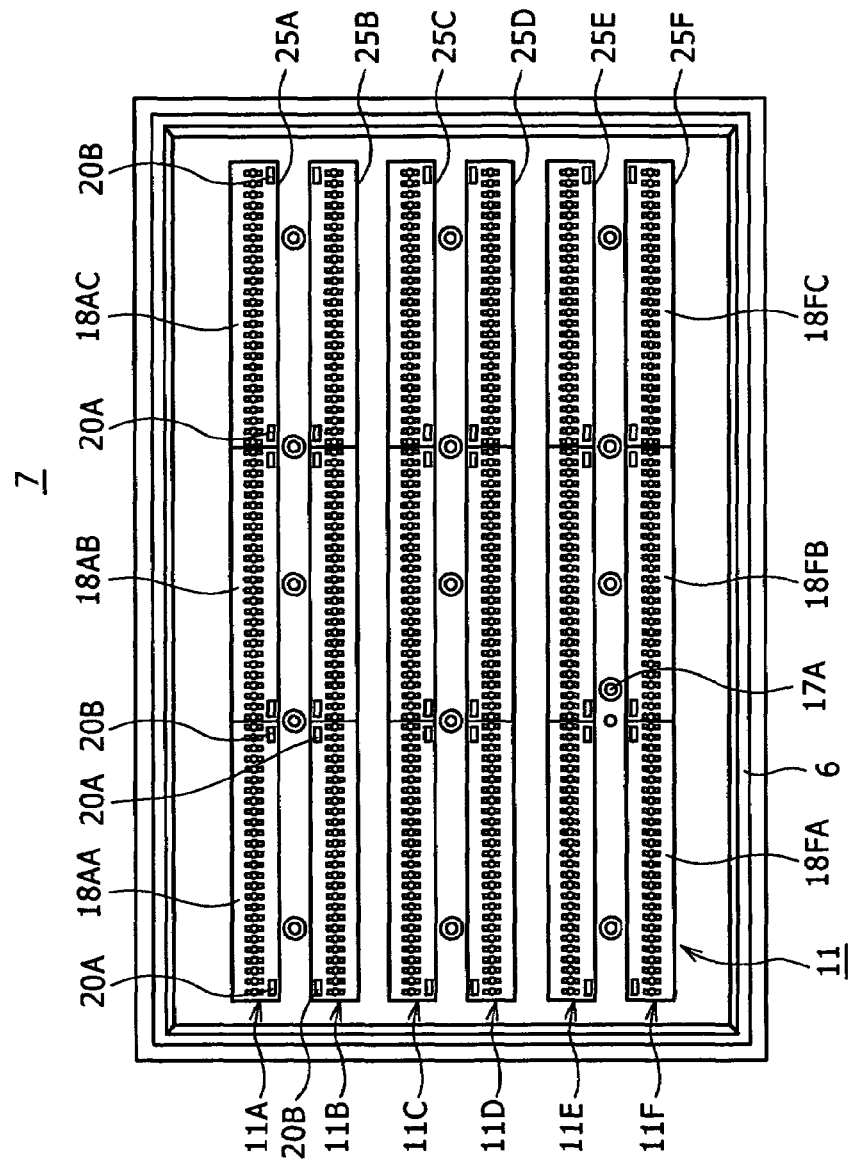
FIG. 3 is a plan view of a radiating unit.

Meanwhile, as shown in FIG. 3, the optical stud members 17 in the optical sheet block 10 are arranged in a matrix including five pieces in the row direction and three pieces in the column direction, i.e., a total of 15 pieces, and the optical stud members 17 are disposed at positions between the rows in the light emitting block 11 including six rows of LEDs 12 as will be described later. In addition, in the optical sheet block 10, the above-mentioned diffusion plate 15 and reflective sheet 16 have different characteristics on the face and back sides thereof, so that they must be combined without mistake as to the face and back sides.

The diffusion plate 15 and the reflective sheet 16 are provided with the mount holes 15b and 16a through which the shaft-like base portions 17a of the optical stud members 17 will penetrate, as above-mentioned. Correspondingly to the optical stud members 17, the diffusion plate 15 and the reflective sheet 16 are provided with the mount holes 15b and 16a in a matrix form including five holes in the row direction and three holes in the column direction, i.e., a total of 15 holes. In the optical sheet block 10, as shown in FIG. 3, the second optical stud member 17A from the left side in the low row is erected on the back panel 9 at a position different from those of the second optical stud members 17 in the upper rows. In the optical sheet block 10, the diffusion plate 15 and the reflective sheet 16 are provided with the second mount holes 15b, 16a from the left side in the low row corresponding to the optical stud member 17A at a position different from those of the mount holes 15b, 16a in the upper rows.

Therefore, in the optical sheet block 10, when the diffusion plate 15 and the reflective sheet 16 are arranged with a mistake as to the face and back sides, they cannot be combined because the mount holes 15b, 16a are not present at the position corresponding to the optical stud member 17A; thus, a mis-combination preventive structure is attained. Incidentally, in the optical sheet block 10, the optical stud member 17A and the mount holes 15b, 16a in the diffusion plate 15 and the reflective sheet 16 which constitute the mis-combination preventive structure may be provided at any of other positions than the center position; however, it is preferable to provide them at inner position rather than outer peripheral position, since each member can be combined in a stable state, and they may be provided at a plurality of positions rather than only one position.

In the backlight unit 3, since the light emitting unit 7 includes the above-mentioned optical sheet block 10, the display light emitted from the LEDs 12 of the light emitting block 11 is efficiently incident on the liquid crystal panel unit 2 in a stable condition. As shown in FIG. 3, the light emitting block 11 is composed of six rows of light emitting arrays 11A to 11F arrayed in a crosswise direction on the first principal surface 9d of the back panel 9. In addition, the light emitting unit 11 has each of the light emitting arrays 11A to 11F composed of three light emitting block bodies 18A (A to C) to 18F (A to C), detailed later, which are arrayed in the longitudinal direction, so that the light emitting unit 11 includes a total of 18 light emitting block bodies 18. Incidentally, the light emitting block bodies 18A (A to C) to 18F (A to C) will be generically called the light emitting block body 18 in the following description, unless they are individually expressed.

Figure 6:
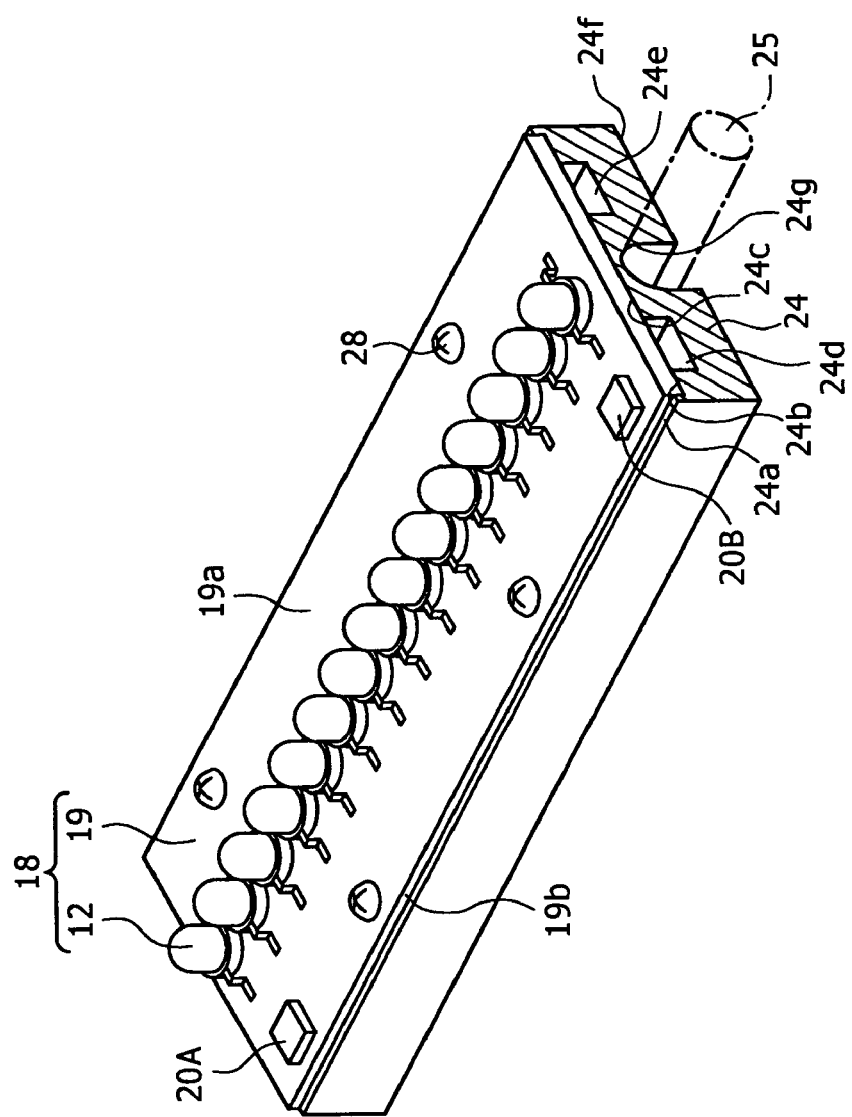
FIG. 6 is a perspective view of an assembly of a light emitting block body and a radiating plate.

As shown in FIGS. 4 and 6, the each light emitting block body 18 is composed of pluralities of red LEDs and green LEDs and blue LEDs (generically called LEDs 12) and a horizontally elongate rectangular wiring substrate 19 having a first principal surface 19a on which the LEDs 12 are mounted in a predetermined order in the longitudinal direction. On each light emitting block body 18, a total of 25 LEDs 12 are mounted in combination of appropriate numbers of red LEDs and green LEDs and blue LEDs. Therefore, the light emitting block 11 includes a total of 450 LEDs 12, with 75 LEDs 12 being present in each of the light emitting arrays 11A to 11F. Incidentally, in the light emitting block 11, the number of the light emitting block bodies 18 and the numbers of the LEDs 12 mounted thereon are appropriately determined according to the size of the display screen, the light emitting ability of each LED 12 and the like.

Though not shown in the figures, the light emitting block body 18 has a structure in which a wiring pattern for connecting the LEDs 12 in series, lands for connecting the terminals of the LEDs 12 and the like are formed on the first principal surface 19a of the wiring substrate 19. The wiring substrates 19 are all formed in the same specifications, and each of them includes mounted thereon a first connector 20A on the signal output side and a second connector 20B on the signal input side which are mounted at positions in the vicinity of one side portion 19b in the width direction of the first principal surface 19a and on both sides in the longitudinal direction. The first connector 20A is a signal outputting connector, and has, for example, a 6-pin structure, though details thereof are omitted. Besides, the second connector 20B is a signal inputting connector, and has, for example, a 5-pin structure, though details thereof are omitted.

The light emitting block 11 has a structure in which, as shown in FIG. 3, three light emitting block bodies 18AA to 18AC are arranged in the longitudinal direction in the first-row light emitting array 11A while each wiring substrate 19 has its one side portion 19b directed to the lower side. In the light emitting block 11, three light emitting block bodies 18BA to 18BC are arranged in the longitudinal direction in the second-row light emitting array 11B while each wiring substrate 19 has its one side portion 19b directed to the light emitting array 11A side. In the light emitting block 11, also as for the other light emitting arrays 11C to 11F, respectively three light emitting block bodies 18 are similarly arranged in the longitudinal direction while the directions of the wiring substrates 19 are alternately reversed.

In the light emitting block 11, the respective second connectors 20B in the light emitting block bodies 18AC to 18FC arranged on the right side of the light emitting arrays 11A to 11F in the respective rows constitute signal input portions for driving the LEDs 12 in the respective rows. In the light emitting block 11, as shown in FIG. 4, the first connector 20A on one side and the second connector 20B on the other side of each light emitting block body 18 which are disposed adjacently are opposed adjacently. In the light emitting block 11, the first connector 20A and the second connector 20B on the other side are connected by connectored lead wires (not shown), whereby the shortest wiring is attained. In the light emitting block 11, on the basis of each of the light emitting arrays 11A to 11F, connectored signal output lead wires 21 are led out from the light emitting block bodies 18AA to 18FA disposed on the left side, are led to the positions between the light emitting arrays 11A to 11F as shown in FIG. 4, are bundled by clampers 22 provided respectively, and are led out to the side of the second principal surface 9e of the back panel 9 through a lead-out opening 23.

In the light emitting block 11, though not shown, on the basis of each of the light emitting arrays 11A to 11F, connectored signal input lead wires are connected respectively to the light emitting block bodies 18AC to 18FC disposed on the right side. The signal input lead wires are taken in through the lead-out opening 23 from the side of the second principal surface 9e of the back panel 9, are bundled by the clampers 22 provided between the light emitting arrays 11A to 11F, and are connected to the light emitting block bodies 18AC to 18FC. In the light emitting block 11, the light emitting blocks 18 in the pairs of light emitting arrays (11A, 11B), (11C, 11D), (11E, 11F) are arranged with their first connector 20A and second connector 20B, provided on the wiring substrate, being opposed to each other.

In the light emitting block 11, as has been mentioned above, a holding and guiding structure for the signal input/output lead wires 21 by utilizing the spaces between the light emitting arrays 11A to 11F is provided, whereby it is contrived to enhance the efficiency of space and to simplify the wiring step. In the light emitting block 11, the relative positions of the first connectors 20A and the second connectors 20B prevent the mis-mounting of the wiring substrates 19, simplify the wiring structure and wiring step between the wiring substrates 19, and enable common use of the lead wires. In the light emitting block 11, laying of the lead wires 21 around to the side of the second principal surface 9e of the back panel 9 is carried out simply. Incidentally, in the light emitting block 11, the signal input lead wires and the signal output lead wires are guided by bundling them by the clampers 22, so that the lead wires cooperate with each other to suppress noises.

Figure 7A:
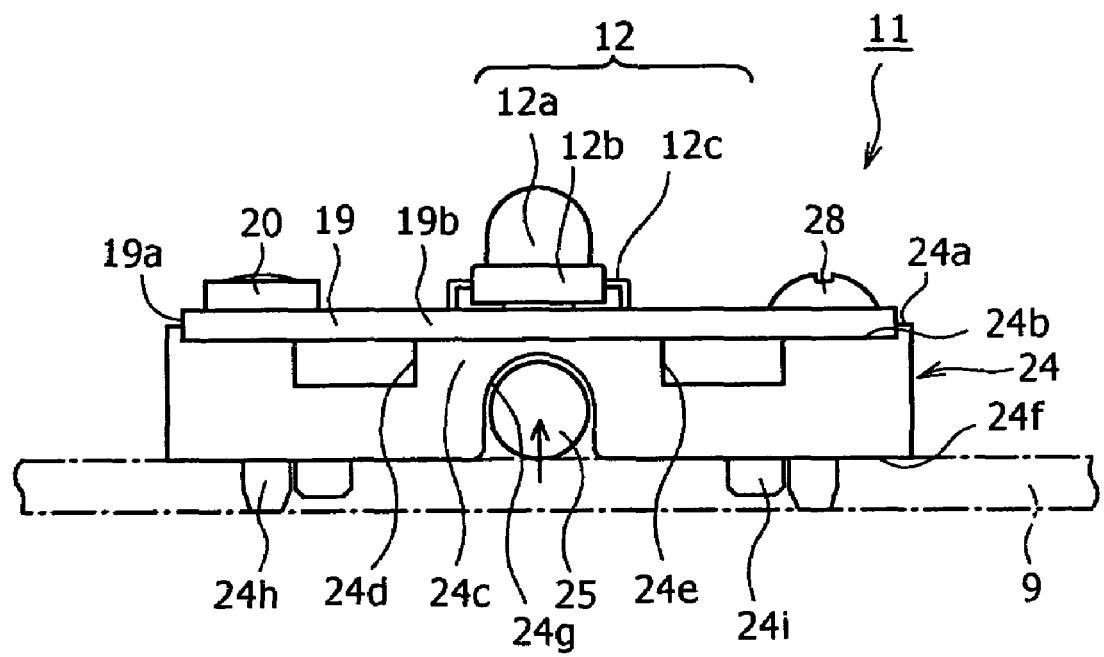
FIGS. 7A and 7B are side views of an assembly of the light emitting block body and the radiating plate.

In the light emitting block body 18, a total of 25 LEDs 12 are mounted on the first principal surface 19a of the wiring substrate 19, in combination of appropriate numbers of red LEDs and green LEDs and blue LEDs arrayed in this order on the same axis line, as above-mentioned. Each of the LEDs 12 has a structure in which, as shown in FIG. 7A, a light emitting device 12a is held by a resin holder 12b and terminals 12c are led out of the resin holder 12b.

In the light emitting block 11, upon a lighting operation of each LED 12 of the light emitting block body 18, display light is emitted and heat is also generated. As above-mentioned, the light emitting unit 7 has a structure in which the light emitting block 11 is combined with the back side of the optical sheet block 10 and the surroundings constitute a closed light guide space portion H, so that a large amount of heat generated from the multiplicity of LEDs 12 is accumulated in the light guide space portion H, to produce a high temperature condition. In the light emitting unit 7, the temperature rise produces various problems such as changing the characteristics of the optical sheet bodies of the optical sheet block 10, making instable the lighting condition of each LED 12, causing irregularity of color or the like in the liquid crystal panel 5, and making instable the operations of electronic component parts and the like constituting the circuit portion.

In the backlight unit 3, the heat generated from the LEDs 12 is efficiently radiated by the radiating unit 8 of the light emitting unit 7, whereby the above-mentioned problems are restrained. The radiating unit 8 is composed of six radiating plates 24A to 24F (hereinafter generically referred to as the radiating plates 24) provided on the basis of each of the light emitting arrays 11A to 11F and functioning also as mount members for the light emitting block bodies 18, six heat pipes 25A to 25F (hereinafter generically referred to as the heat pipes 25) mounted respectively to the radiating plates 24, a left-right pair of heat sinks 26A and 26B (hereinafter generically referred to as the heat sinks 26) to which both end portions of the heat pipes 25 are connected, and a cooling fan 27 for promoting the cooling function of the heat sink 26, and the like. As will be detailed later, the radiating unit 8 has the heat pipe 25 integrally mounted to each radiating plate 24 so as to constitute an efficient heat conduction path for heat conduction to the heat sink 26.

The radiating plates 24 are formed by use of an aluminum material excellent in thermal conductivity, good in workability, light in weight and inexpensive, and are formed by extrusion into an elongate rectangular plate-like shape having roughly the same length and width as those of the above-mentioned light emitting arrays 11A to 11F. Each radiating plate 24 functions also as a mount portion for the light emitting block body 18, and is formed to has a predetermined thickness to have mechanical rigidity. Incidentally, the radiating plates 24 are not limited to the aluminum material, and may be formed of other materials having good thermal conductivity, for example, aluminum alloy materials, magnesium alloy materials, silver alloy materials, copper materials, or the like. The radiating plates 24, where they are comparatively small in size, are formed by an appropriate working method, for example, press working, cutting or slitting, or the like.

In the radiating plate 24, as shown in FIG. 6 and FIG. 7A, the wiring substrates 19 of the light emitting block bodies 18 are combined with each other with their end faces in the longitudinal direction abutted on each other, with the first principal surface 24a as an laminating surface. The radiating plate 24 has the first principal surface 24a provided, over the whole length thereof, with a substrate fitting recessed portion 24b in which the wiring substrate 19 is to be fitted. In the radiating plate 24, the substrate fitting recessed portion 24b has roughly the same width as that of the wiring substrate 19, has a height roughly equal to the thickness of the wiring substrate 19, and is combined with the wiring substrate 19 while holding a second principal surface 19c and both side edge portions in the width direction of the wiring substrate 19. In the radiating plate 24, the wiring substrate 19 combined with the substrate fitting recessed portion 24b is fixed onto the first principal surface 24a by a plurality of mount screws 28.

The radiating plate 24 has a central region in the width direction left as a projected portion with a predetermined width in the substrate fitting recessed portion 24b, to constitute a receiving surface portion 24c in the longitudinal direction with which the second principal surface 19c of the wiring substrate 19 is to make close contact, and lightening recessed portions 24d, 24e are formed on both sides of the receiving surface portion 24c over the whole length in the longitudinal direction. In the radiating plate 24, the receiving surface portion 24c is formed with a width corresponding to an LED mount region 19d with the LEDs 12 mounted thereon of the wiring substrate 19 as shown in FIG. 7A so that heat is efficiently transferred and radiated from the LED mount region 19d which is heated most upon the lighting operation of the LEDs 12. While the radiating plate 24 has been provided with the lightening recessed portions 24d, 24e for lightening in weight and for holding dimensional accuracy, the lightening recessed portions 24d, 24e may also be formed as heat pipe fitting portions.

The radiating plate 24 is provided with a heat pipe fitting recessed portion 24g for fitting the heat pipe 25 therein on the side of a second principal surface 24f opposite to the first principal surface 24a thereof. The radiating plate 24 is integrally provided, at appropriate positions of its second principal surface 24f, with pluralities of mount stud portions 24h and positioning dowels 24i constituting mount portions for mounting on the back panel 9. The heat pipe fitting recessed portion 24g is composed of a recessed groove roughly arch-shaped in section which is formed over the whole range in the longitudinal direction at a roughly central portion in the width direction opposed to the receiving surface portion 24c. As will be described later, the heat pipe fitting recessed portion 24g is formed with such an opening shape that the heat pipe 25 fitted in the heat pipe fitting recessed portion 24g can be tentatively held without utilizing holding members or the like. The heat pipe fitting recessed portion 24g is formed with an opening width roughly equal to the outside diameter of the heat pipe 25 and a somewhat smaller height (depth).

In the radiating unit 8, the heat pipe fitting recessed portion 24g is formed over the whole length in the longitudinal direction on the side of the second principal surface 24f of the radiating plate 24 so as to mount one heat pipe 25 therein; in this case, for further enhancing the radiating capability, for example, two or more heat pipes 25 may be mounted to the radiating plate 24. Since mounting the heat pipes 25 to the same location leads to a lowering in heat conduction capability due to interference between the heat pipes 25, it is preferable that two or more heat pipe fitting recessed portions 24g for each mounting one heat pipe 25 therein and being parallel to each other are adjacently formed in the second principal surface 24f.

In the radiating unit 8, in the case of mounting for example two or more heat pipes 25 to the radiating plate 24, the heat pipes 25 are made to have the same diameter, in view of that the heat pipes 25 with different outside diameters show little difference in heat conduction capability. With such a measure, in handling the heat pipes 25, it is possible to contrive common use of component parts, prevention of mis-mounting, and the like.

In the radiating unit 8, one heat pipe 25 is mounted into the heat pipe fitting recessed portion 24g formed in each radiating plate 24. In the radiating unit 8, on the basis of the configuration of the transmission type liquid crystal display panel 1, there may be the case where, for example, mount portions for component parts or the like must be formed at intermediate portions of the heat pipe fitting recessed portion 24g, and the case where the heat sinks 26 cannot be evenly disposed on the left and right sides and therefore the heat pipe 25 becomes large in length, leading to a lowering in heat conduction capability at a tip end portion thereof. In the radiating unit 8, two short heat pipes 25 may be mounted in the heat pipe fitting recessed portion 24g by fitting them from the left and the right.

In the radiating unit 8, as above-mentioned, each radiating plate 24 is provided with the heat pipe fitting recessed portion 24g and the heat pipe 25 is mounted in the inside of the heat pipe fitting recessed portion 24g, whereby the heat pipe 25 is disposed at a position closer to the LED mount region 19d which is the most heated up of the wiring substrate 19. In the radiating unit 8, the radiating plates 24 having a predetermined thickness are used. The radiating plate 24 is provided with the heat pipe fitting recessed portion 24g in which the interval (thickness) between a top portion and the receiving surface portion 24c is about 1 mm, for example, whereby the LEDs 12 mounted on the wiring substrate 19 having a thickness of about 1.7 to 1.8 mm and the heat pipe 25 are disposed opposite to each other at an interval of not more than 2 mm, and efficient radiation of heat is achieved.

In the radiating unit 8, the radiating plate 24 with the heat pipe 25 mounted in the heat pipe fitting recessed portion 24g functions also as a holding member for the heat pipe 25, so that precise handling of the heat pipe 25 at the time of assembly or the like is simplified, and generation of bending, breakage or the like is prevented. In the radiating unit 8, each radiating plate 24 has the light emitting block body 18 and the heat pipe 25 combined in the mutually positioned condition and in the close condition, so that an efficient heat conduction path is formed between the light emitting block body 18 and the heat pipe 25. In the radiating unit 8, it is contrived to simplify the step of mounting the heat pipe 25 onto the radiating plate 24.

In the radiating unit 8, each radiating plate 24 is fixed to the back panel 9 while being precisely positioned through the mount stud portions 24h and the positioning dowels 24i, in the condition where the light emitting block body 18 is combined with the substrate fitting recessed portion 24b and where the heat pipe 25 is mounted in the heat pipe fitting recessed portion 24g. Incidentally, each radiating plate 24 may be fixed onto the first principal surface 9d of the back panel 9 by utilizing the mount screws 28 for fixing the wiring substrate 19.

While the radiating plate 24 has been provided with the heat pipe fitting recessed portion 24g as a recessed portion arch-shaped in section so that it can be formed by extrusion to be high in dimensional accuracy, the heat pipe fitting recessed portion 24g is not limited to such a shape. It suffices for the heat pipe fitting recessed portion 24g to be so shaped as to hold the heat pipe 25 by fitting and to hold the close contact with the outer peripheral portion of the heat pipe 25; the heat pipe fitting recessed portions 24g may be formed in an appropriate shape, for example, a shape with a rectangular section, a recessed portion formed with a multiplicity of recessed and projected streaks, or the like.

Meanwhile, in the radiating plate 24, the heat pipe 25 mounted in the heat pipe fitting recessed portion 24g has been pushed by the back panel 9 into close contact with the inner wall of the heat pipe fitting recessed portion 24g. However, there may be a case where a gap is generated partly between the inner wall and the heat pipe 25 due to, for example, dimensional accuracies of portions, dimensional accuracy of the back panel 9, or the like, leading to a lowering in thermal conductivity. In view of this, in the radiating plate 24, there may be adopted a configuration in which, for example, the heat pipe 25 is caulked into a heat pipe fitting recessed portion 24j by a caulking structure, as shown in FIG. 7B.

In the radiating plate 24, the heat pipe fitting recessed portion 24j is formed with a depth roughly equivalent to the outside diameter of the heat pipe 25, and opposed opening edge portions of the heat pipe fitting recessed portion 24j are integrally provided with caulking projected portions 24k, 24l over the whole length thereof. The caulking projected portions 24k, 24l may be formed on either one of the opening edge portions of the heat pipe fitting recessed portion 24j, or may be formed partly. In the case where the caulking projected portions 24k, 24l are formed partly at the opposed opening edge portions, they may be provided in an alternately staggered pattern, for example.

Figure 7B:
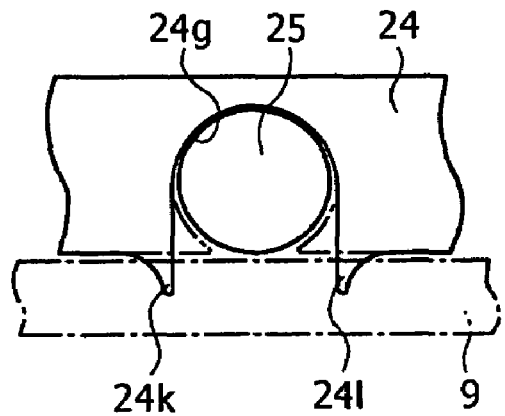

In the radiating plate 24, in the condition where the heat pipe 25 is mounted in the heat pipe fitting recessed portion 24j, the caulking projected portions 24k and 24l are caulked, i.e., are bent into the heat pipe fitting recessed portion 24j as indicated by chain lines in FIG. 7B. In the radiating plate 24, the heat pipe 25 is pushed by the caulking projected portions 24k and 24l into close contact with the inner wall of the heat pipe fitting recessed portion 24j. The integration of the radiating plate 24 with the heat pipe 25 is contrived more securely, and enhancement of the close contact between the radiating plate 24 and the back panel 9 is also contrived.

In the radiating plate 24, the heat pipe fitting recessed portion 24g, 24j opening to the second principal surface 24f has been formed and the heat pipe 25 has been mounted from the side of the second principal surface 24f, but this structure is not limitative. In the radiating plate 24, a heat pipe fitting hole opening at least at one end portion in the longitudinal direction may be formed and the heat pipe 25 may be mounted in the heat pipe fitting hole. In the radiating plate 24, further, a heat pipe fitting recessed portion opening at an end face or faces in the width direction may be formed.

The heat pipe 25 is a member generally adopted for conduction of heat from a power supply portion or the like brought to a high temperature in various electronic apparatuses or the like to a radiating section, is configured by evacuating a pipe member made of a metallic material such as copper excellent in thermal conductivity and charging the pipe member with a heat conducting medium evaporated at a predetermined temperature, such as water, and has an ability to conduct heat efficiently. The heat pipe 25 is integrally mounted to each radiating plate 24 as above-mentioned, and, together with the radiating plate 24, is connected at both end portions thereof to the heat sinks 26. In the heat pipe 25, upon receiving heat conducted from the radiating plate 24 on the high temperature side, the heat conducting medium sealed in the inside of the heat pipe 25 is evaporated from liquid to gas. In the heat pipe 25, the evaporated heat conducting medium flows through the pipe to a connection portion for connection with the heat sink 26 on the low temperature side, where it is cooled to be liquefied while discharging the heat of condensation. In the heat pipe 25, the liquefied heat conducting medium moves to the side of the radiating plate 24 by capillarity through a multiplicity of longitudinal grooves formed in the inner wall of the metallic pipe or through a porous layer, with the result of circulation of the medium in the pipe, whereby a highly efficient heat conducting function is displayed.

The heat pipe 25 is integrally mounted in the heat pipe fitting recessed portion 24g of the radiating plate 24 as above-mentioned, whereby it is provided on the basis of each of the light emitting arrays 11A to 11F, and is opposed to the light emitting block body 18. The heat pipe 25 is mounted in the heat pipe fitting recessed portion 24g, with a part of an outer peripheral portion thereof projecting from the opening portion. With the radiating plate 24 mounted to the back panel 9, the projecting portion of the heat pipe 25 is pushed toward the inside of the heat pipe fitting recessed portion 24g as indicated by arrow in FIG. 7A, whereby the outer peripheral portion of the heat pipe 25 is brought into close contact with the inner wall of the heat pipe fitting recessed portion 24g. The heat pipe 25 is mounted to the radiating plate 24 as above-mentioned without needing a holding member, and is held in the close contact condition in the heat pipe fitting recessed portion 24g. Generally, the heat pipe 25 is combined by applying a silicone grease or the like to a mount portion thereof for holding the close contact property between it and a radiating member; however, the above-mentioned structure eliminates the need for such a measure as application of grease.

Incidentally, the heat pipe 25 is integrated with the radiating plate 24 more securely by applying the caulking structure shown in FIG. 7B above or the structure of mounting into the inside to the radiating plate 24.

In the radiating unit 8, the heat pipe 25 having a highly efficient heat conducting ability is integrally mounted to the radiating plate 24 configured as above, whereby the heat pipe 25 is extended beneath and in proximity to the array region of the LEDs 12 serving as the heat generation source. In the radiating unit 8, the wiring substrate 19 carrying the LEDs 12 mounted thereon, the radiating plate 24 holding the wiring substrate 19 and the heat pipe 25 are laid on each other in close contact with each other to constitute a thermal conductor for conduction of heat to the heat sinks 26. In the radiating unit 8, spatial efficiency is contrived by such a configuration, and the heat generated from the LEDs 12 is extremely efficiently conducted to the heat sinks 26 and thereby radiated, whereby the rise in the temperature in the light guide space portion H is reduced, and the backlight unit 3 is stably operated to supply display light to the liquid crystal panel 5.

Figure 8:
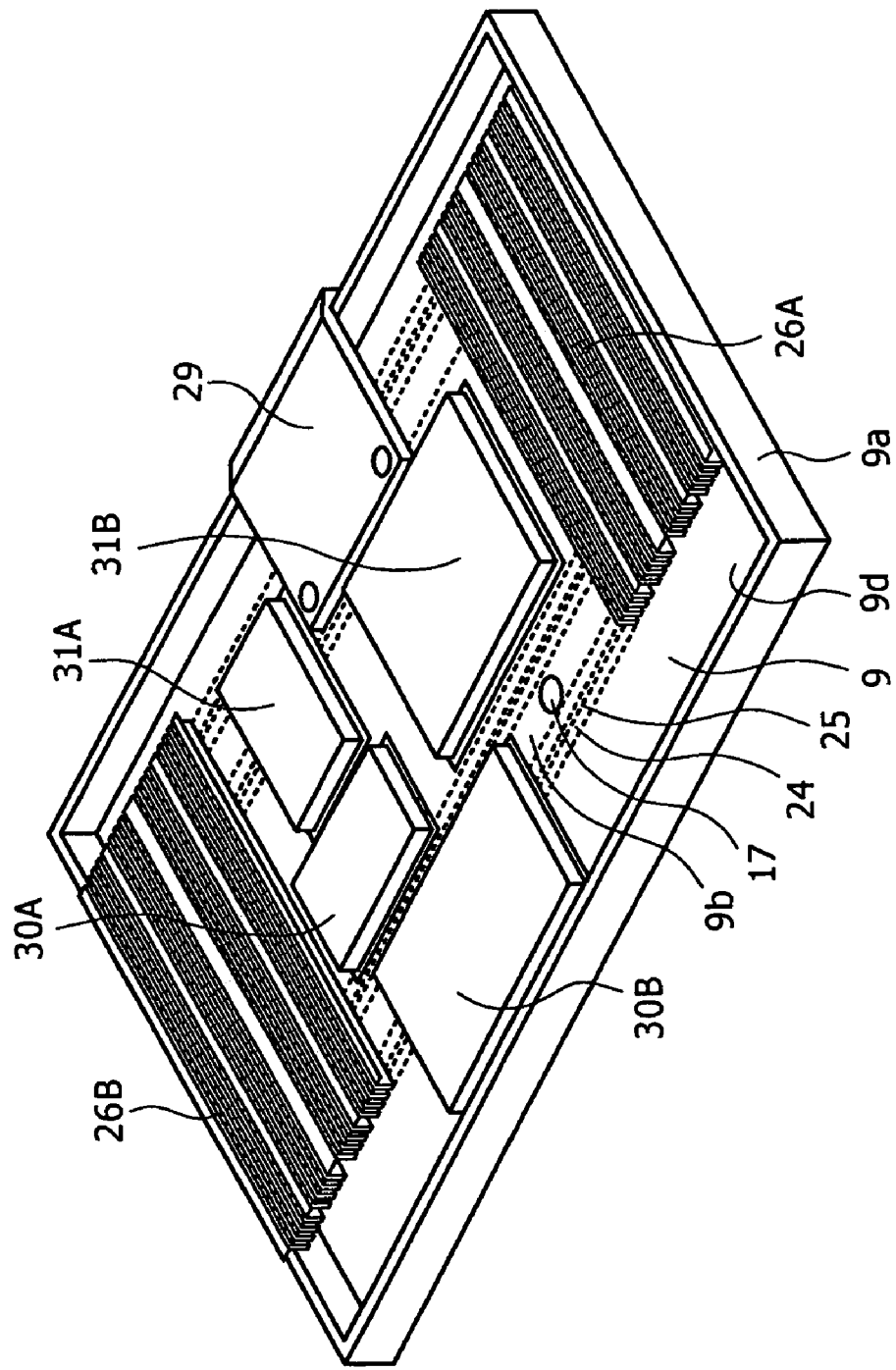
FIG. 8 is a perspective view, from the back side, of a major part of the transmission type liquid crystal display panel.

In the radiating unit 8, as shown in FIG. 8, the heat sinks 26 are mounted to the second principal surface 9e of the back panel 9 at positions on both sides in the longitudinal direction. The heat sinks 26 also are used singly or in combination with the heat pipe 25, as a radiating member for a power supply portion or the like in various electronic apparatuses and the like. The heat sink 26 is a member provided with a larger surface area by integrally forming it with a multiplicity of fins from an aluminum material or the like having an excellent thermal conductivity. The heat sinks 26 received the heat conducted from the high temperature portion side, and radiates the heat from the surfaces of the fins, to thereby cool the high temperature portion.

The heat sink 26 displays a higher heat radiating function as it is larger in size, but this increases the thickness and size of the backlight unit 3 or the apparatus as a whole. The heat sink 26 is a component part which is large in size and weight, and is complicated in structure in the case where, for example, it is attached directly to the wiring substrate or the like, since there is need for mount bracket members for maintaining insulation between the heat sink and the circuit component parts, wiring patterns or the like, and for heat conduction members interposed between the heat sink and high-temperature portions.

In the radiating unit 8, the large heat sink 26 needing the above-mentioned measure are provided together with the multiplicity of radiating plates 24 and heat pipes 25 by skillfully arranging them onto the back panel 9, whereby an increase in size is suppressed so that the heat generated from the multiplicity of LEDs 12 of the light emitting unit 7 is radiated efficiently. In the radiating unit 8, the above-mentioned configuration of the radiating plates 24 and the heat pipes 25 eliminates the need for providing the back panel 9 with a relief recessed portion along the layout route of the heat pipe 25, whereby the back panel 9 as a whole can be formed in a flat shape. In the radiating unit 8, the heat sinks 26 are mounted to both left and right side positions on the second principal surface 9e of the flat-shaped back panel 9 as above-mentioned, whereby a flat portion is formed in a central region of the back panel 9.

Meanwhile, the back panel 9 is formed in a horizontally elongate rectangular plate-like shape having a size roughly equivalent to the outside shape of the liquid crystal panel 5 from, for example, an aluminum material being comparatively light in weight and having mechanical rigidity. The back panel 9 itself has thermal conductivity, thereby having the function of radiating the heat generated from the light guide space portion H, circuit component parts and the like. As has been mentioned above, the back panel 9 is provided at its outer peripheral portions with the outer peripheral wall portion 9a to be combined with the front frame member 6, a multiplicity of mount portions 9b for mounting of the optical stud members 17, mount holes for fixing the radiating plates 24 or the lead-out openings 23 for leading out the lead wires 21, and the like. The radiating unit 8, the light emitting unit 7 and the liquid crystal panel 5 are laminatedly combined with the front side of the back panel 9, and the back panel 9 is mounted onto a mount portion of the casing 33.

The transmission type liquid crystal display panel 1 is provided with control circuit packages for driving the liquid crystal panel 5 and controlling the lighting operations of the LEDs 12 of the light emitting unit 7, and the back panel 9 functions also as a panel for mounting these control circuit packages, as shown in FIG. 8. Though details are omitted, the control packages include a liquid crystal controller 29 for outputting operation control signals to the liquid crystal panel 5, power supply control units 30A and 30B for controlling power supply portions of the liquid crystal panel 5 and the light emitting unit 7, and LED control units 31A and 31B for controlling the operations of the light emitting unit 7.

In the transmission type liquid crystal display panel 1, the second principal surface 9e of the back panel 9 is provided with the flat region between the heat sinks 26A and 26B disposed at the left and the right as has been described above, and the above-mentioned control circuit packages 29 to 31 are mounted on the flat region. In the transmission type liquid crystal display panel 1, the control circuit packages 29 to 31 are mounted on the flat region, whereby they can be firmly mounted without lifting or the like, by a simple step. In the liquid crystal display panel 1, the control circuit packages 29 to 31 are thinner than the large-sized thick heat sinks 26, so that the thin form of the liquid crystal display panel 1 as a whole is maintained.

Incidentally, the control circuit packages 29 to 31 are mounted on a control substrate (not shown), and the control substrate is mounted to the back panel 9. The control substrate is mounted to the back panel 9 at a position between the heat sinks 26 disposed on both sides of the back panel 9 as will be described later.

In the transmission type liquid crystal display panel 1, the large-sized screen is provided as above-mentioned, and display light is supplied to the liquid crystal panel 5 from a light source composed of the multiplicity of LEDs 12 provided in the light emitting unit 7. The liquid crystal display panel 1 is provided with the radiating unit 8 configured as above-mentioned, whereby the heat generated from the LEDs 12 is efficiently conducted through the radiating plates 24 and the heat pipes 25 to the heat sinks 26 and thereby radiated, so that accumulation of large capacity of heat in the light guide space portion H or the like is prevented. In the transmission type liquid crystal display panel 1, the characteristics of each optical sheet and the like are maintained, and the whole part of the large-sized screen of the liquid crystal panel 5 is maintained in a substantially uniform temperature distribution, whereby uniform pictures and the like free of irregularity in color can be obtained, and the operations of the control circuit packages 29 to 31 are stabilized.

Figure 9A:
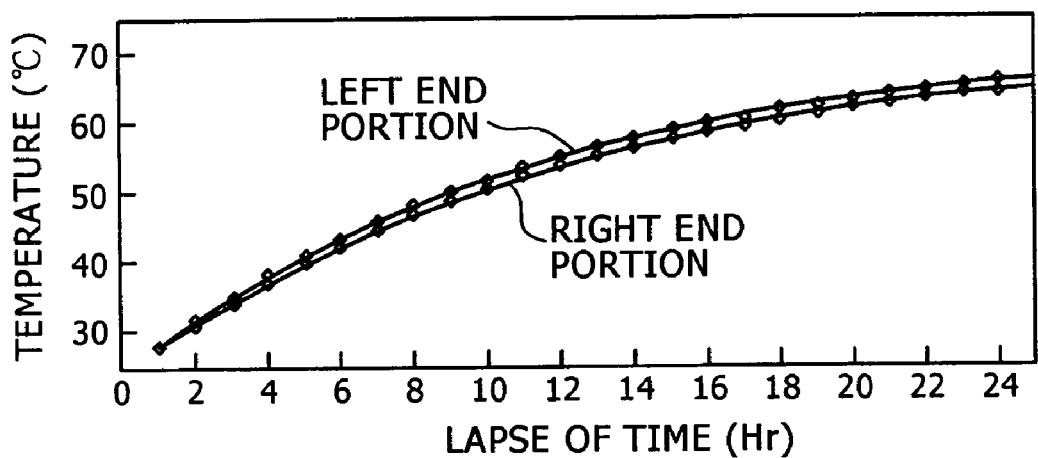
FIGS. 9A and 9B are radiation characteristic diagrams of a radiating unit having a heat pipe and a heat sink.
Figure 9B:
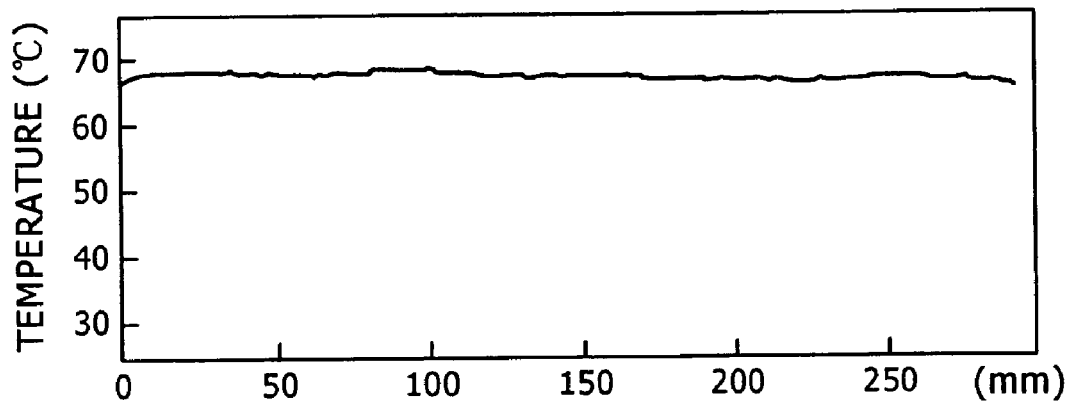

FIGS. 9A, 9B, 10A, and 10B show the results of measurement of radiation characteristics of first and radiating units. The first radiating unit is composed of a heat conduction member combined with a heat pipe and a heat sink, and the second radiating unit is composed of a heat conduction member and a heat sink. The measurement was carried out by a method in which DDC heat sinks with 34 W impressed thereon are divided from the center, only the right side is left, and, in this condition, temperatures at both left and right end portions and a central portions were measured with the lapse of time. In the first radiating unit, as shown in FIG. 9A, the overall temperature is gradually raised with the lapse of time, but the temperature difference between the portions is in a stable condition within 1° C. Besides, in the first radiating unit, as shown in FIG. 9B, efficient conduction of heat to the heat sink is achieved through the functions of the heat conduction member and the heat pipe also at the left end portion where the heat sink is absent, whereby a substantially constant temperature distribution is maintained over the entire region.

Figure 10A:
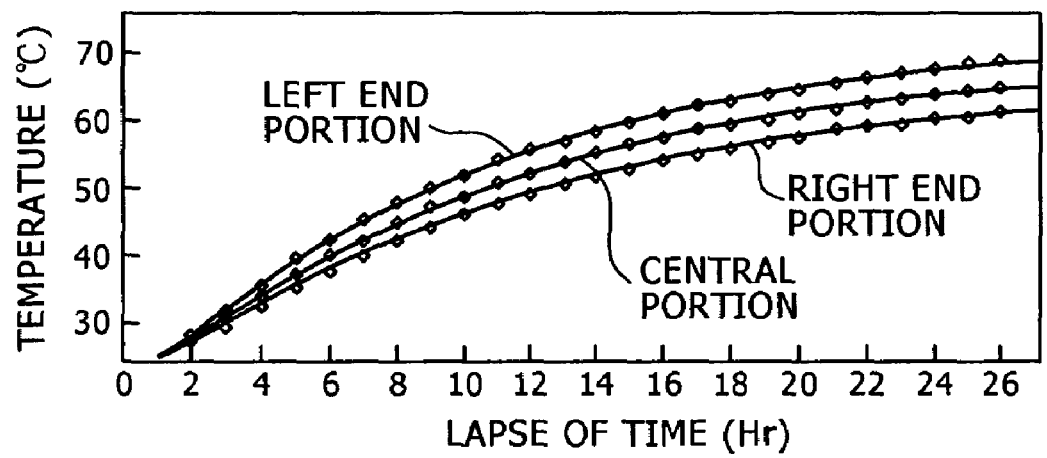
FIGS. 10A and 10B are radiation characteristic diagrams of a radiating unit having a heat sink.
Figure 10B:
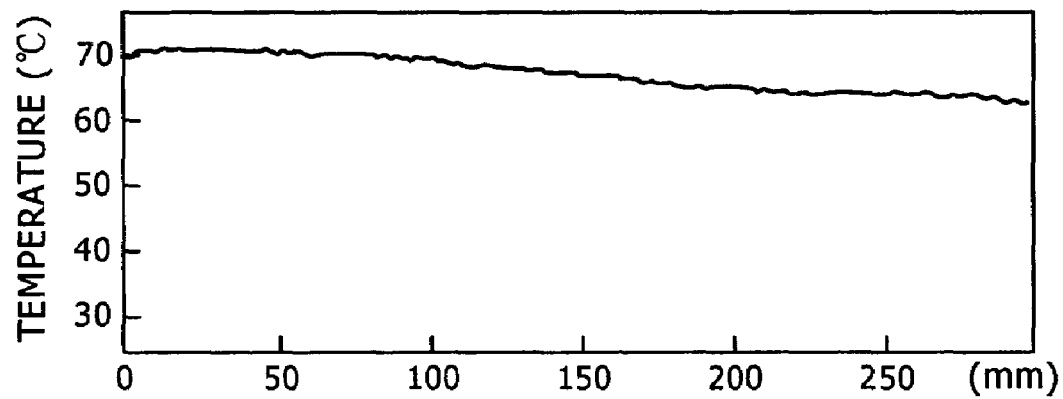

On the other hand, in the second radiating unit, as shown in FIG. 10A, the overall temperature is gradually raised with the lapse of time, and the right end portion where a heat sink is provided is suppressed in temperature rise due to the radiating action of the heat sink, with the result that the temperature difference between the right end portion and the left end portion is gradually increased. In the second radiating unit, the temperature distribution after the lapse of 26 hours, for example, shows a maximum temperature difference between the right end portion and the left end portion of no less than 7° C., as shown in FIG. 10B. Therefore, in a radiating unit, by a configuration in which a heat conduction member combined with a heat pipe is combined with a heat sink, heat is efficiently conduced from a high temperature portion to the heat sink and thereby radiated, and a uniform temperature distribution over the whole region is contrived.

In the radiating unit 7, each heat sink 26 is combined with the cooling fan 27 as above-mentioned, whereby enhancement of heat radiating efficiency is contrived. With air blown by the cooling fan 27 to the portions between the fins of each heat sink 26, the radiation of heat from the surfaces of the fins is promoted. In the radiating unit 7, pairs of cooling fans (27A, 27B), (27C, 27D) are mounted to the heat sinks 26, respectively. The cooling fans 27 also are generally used as cooling and heat-radiating devices for high-temperature portions, by being mounted to a casing or the like in various electronic apparatuses and the like. Incidentally, each heat sink 26 is so configured that each fin is closed by, for example, a back cover of the casing, exclusively of the mount portion for the cooling fan 27, whereby a conduit for the cooling airflow is maintained.

Figure 12A:
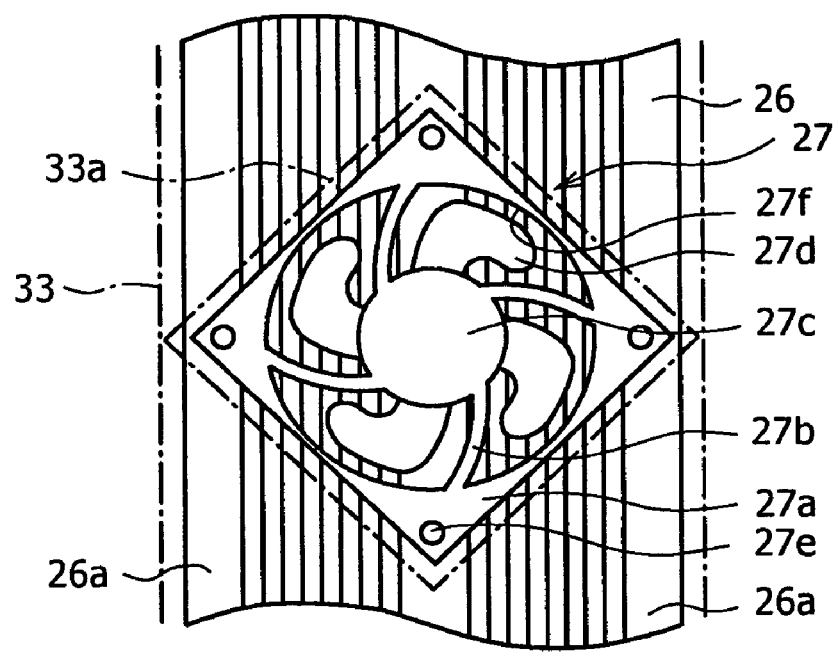
FIGS. 12A and 12B are plan views of a major part showing the structure of mounting the cooling fan to the heat sink.
Figure 12B:
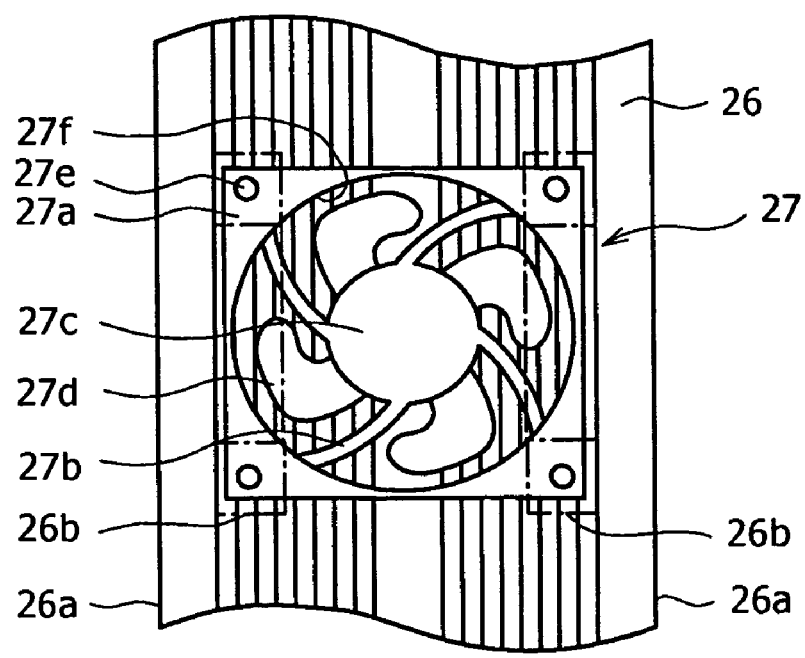

As shown in FIGS. 12A and 12B, the cooling fan 27 is composed of a square frame-like casing 27a, a motor unit 27c disposed at a central portion of the casing 27a through a plurality of arm portions 27b, a fan 27d rotated by the motor unit 27c, and the like. The cooling fan 27 is provided with mount portions 27e at the four corners of the casing 27a, and is provided with opening portions 27f penetrating therethrough in the thickness direction between the arm portions 27b. As shown in FIG. 12A, the cooling fan 27 is mounted in the condition where the opening portions 27f front on an opening 33a formed in a back cover of the casing 33. With power supply thrown to the motor unit 27c of the cooling fan 27, the fan 27d is rotated, whereby air is sucked in from one side of the opening portions 27f and is exhausted on the other side. As the cooling fan 27, a so-called vertical type cooling fan is used.

Figure 11:
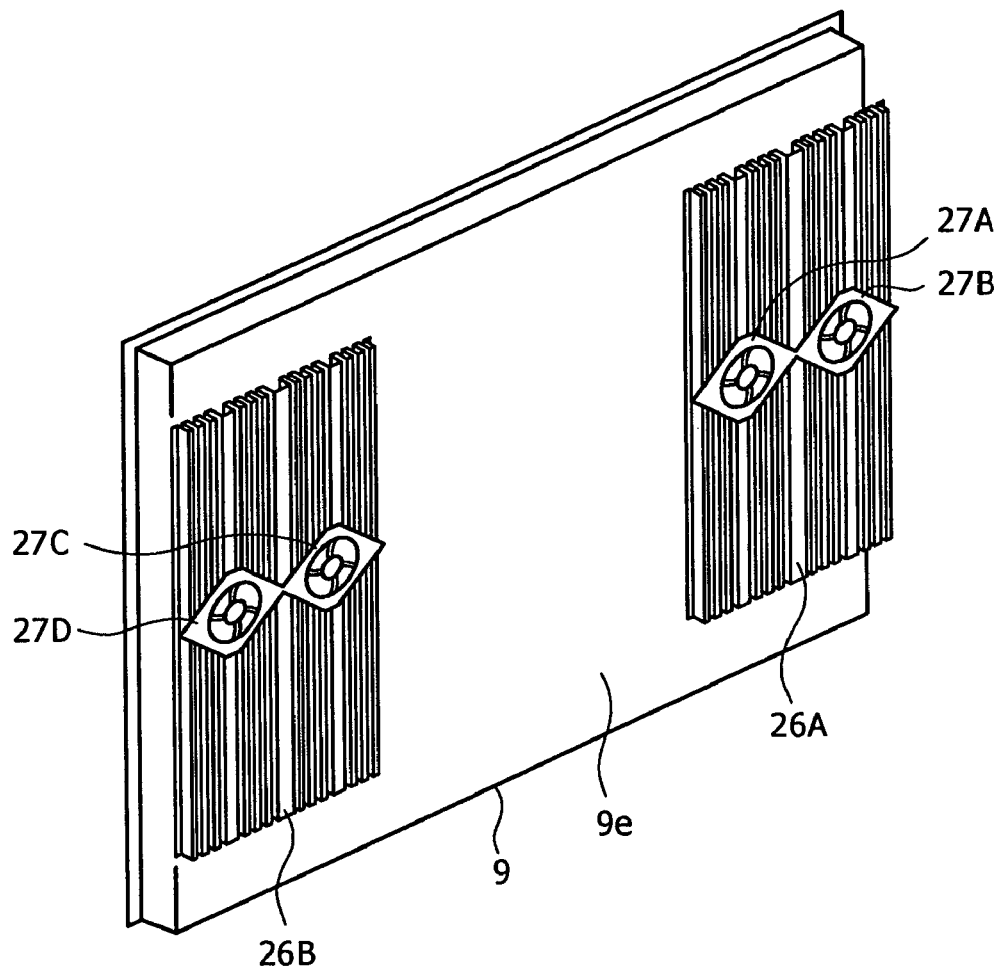
FIG. 11 is a perspective view, from the back side, of a major part of a transmission type liquid crystal display panel having a combination of a cooling fan with a heat sink.

The cooling fan 27 is mounted to a back surface portion of the heat sink 26 by, for example, screwing the mount portions 27e onto large-width mount portions 26a, 26a, and feeds air from the opening portions 27f to the portions between the fins of the heat sink 26, to cool the fins and the heat sink 26. As shown in FIG. 11, each cooling fan 27 is mounted to a roughly central position in the longitudinal direction of the heat sink 26, thereby cooling the heat sink 26 uniformly in the vertical direction.

Meanwhile, when the cooling fan 27 is mounted in the condition where the sides of the casing 27a are parallel to the direction of the fins as shown in FIG. 12B, the opening portions 27f are partly closed by the mount portions 26b, 26b of the heat sink 26, whereby the blast of air to the portions between the fins is reduced, and the cooling efficiency is thereby lowered. In view of this, the cooling fan 27 is fixed in the condition where the sides of the casing 27a are inclined at 45 degrees against the direction of the fins as shown in FIG. 12A, whereby the opening portions 27f are opposed to the fins over the whole area, more blast of air is secured, and the heat sink 26 is efficiently cooled.

In the radiating unit 7, the control circuit packages 29 to 31 are mounted on the flat region formed between the heat sinks 26 as above-mentioned, whereby a thinner form is contrived. In the radiating unit 7, when the cooling fans 27 are mounted on the back surface of the heat sinks 26, the cooling fans 27 project to the back side, so that the effect of the above-mentioned thinner form cannot be displayed sufficiently.

Figure 13:
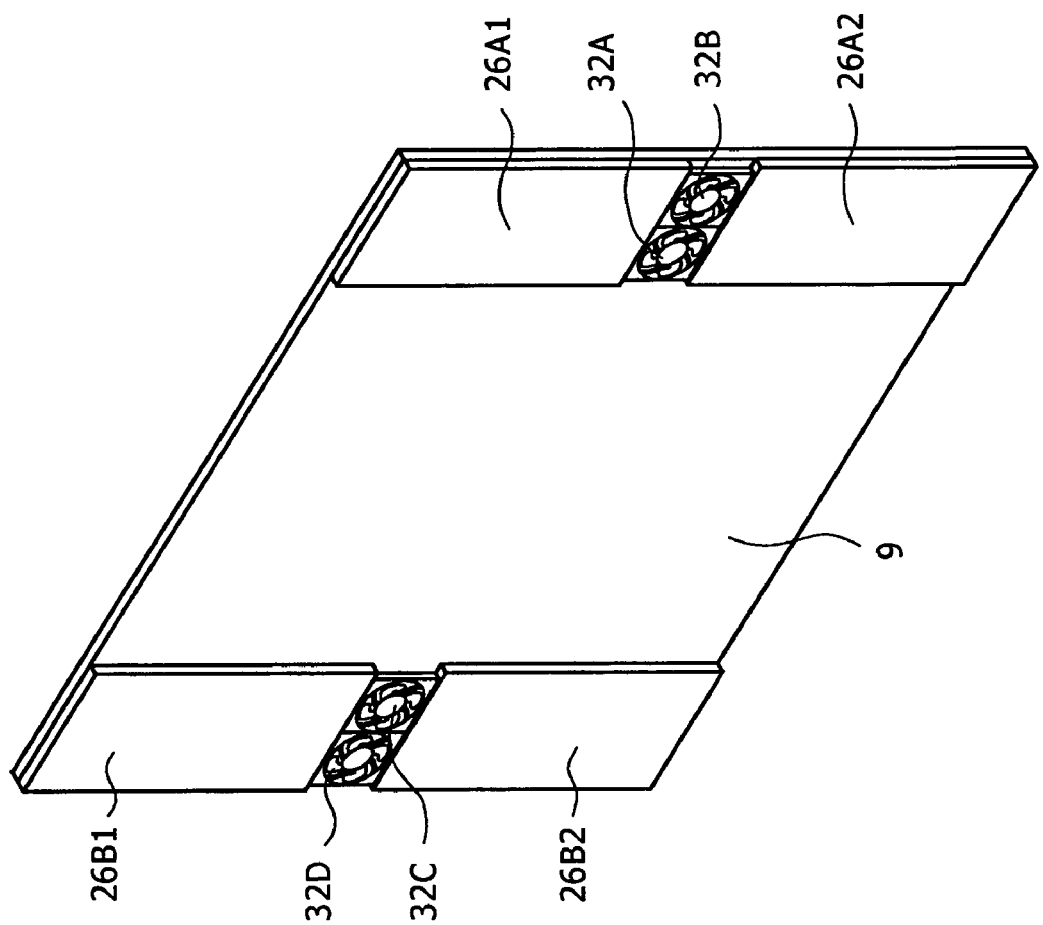
FIG. 13 is a perspective view, from the back side, of a major part of a transmission type liquid crystal display panel having another combined structure of a heat sink and a cooling fan.

In view of this, in the radiating unit 7, as shown in FIG. 13, the left and right heat sinks 26 may be composed of an upper heat sink 26A1 and a lower heat sink 26A2 and of an upper heat sink 26B1 and a lower heat sink 26B2, respectively. In the radiating unit 7, the upper heat sinks 26A1, 26B1 and the lower heat sinks 26A2, 26B2 are mounted to the back panel 9 while facing each other so as to secure therebetween a space sufficient for disposing the cooling fan 32 at a roughly central position in the height direction.

As for the cooling fans 32, two of them 32A, 32B are disposed between the upper heat sink 26A1 and the lower heat sink 26A2 on one side, and two of them 32C, 32D are disposed between the upper heat sink 26B1 and the lower heat sink 26B2 on the other side. The cooling fans 32 are the same as the above-mentioned vertical type cooling fans 27 in basic configuration, but they are so-called horizontal type cooling fans in which an opening portion is provided in an outer peripheral side surface of the casing 27a and air is blown in an outer peripheral direction, and they are mounted directly to the back panel 9. Therefore, in the radiating unit 7, the cooling fans 32 are each disposed between the heat sinks divided as shown in FIG. 13, whereby the amount of projection from the back surface side of the back panel 9 is restricted, and a thinner form is contrived.

Incidentally, as for the cooling fans 32, not only the specification in which outside air is sucked in and blown to the portions between the fins of the heat sink 26 as above-mentioned may be used, but also the specification in which the cooling fans 32 are each reversely mounted and air is sucked out of the portions between the fins of the heat sink 26 and exhausted to the exterior may be used.

In the radiating unit 7, a left-right pair of heat sinks 26 are mounted to the back panel 9 as above-mentioned. The heat sink 26 is integrally formed with a multiplicity of small fins opposed parallel to each other, from an aluminum material, and shows a characteristic shape when cut vertically. Therefore, in the liquid crystal display panel 1, an opening portion 34 is formed at a part of the casing 33 as shown in FIG. 14, and the heat sink 26 is mounted to the back panel 9 so that an end portion 26c thereof is exposed via the opening portion 34 to the exterior.

The casing 33 has the opening portion 34 having an opening size roughly equal to the sectional shape of the heat sink 26, and is so fitted that a tip end portion of the heat sink 26 is roughly flush with the outside surface. Therefore, in the liquid crystal display panel 1, the tip end portion of the heat sink 26 exposed at the opening portion 34 constitutes a part of the armor together with the casing 33, and its peculiar shape and color constitute a peculiar design. In the liquid crystal display panel 1, a part of the heat sink 26 is directly exposed to the exterior, whereby enhancement of cooling efficiency is contrived also.

While the above embodiments have been shown as transmission type liquid crystal display panel 1 for use as a display panel for a TV set having a large-size display screen of 40 inches or more, the present invention is applicable to various liquid crystal display apparatuses having large screens.

It should be understood by those skilled in the art that various modifications, combinations, sub-combinations and alterations may occur depending on design requirements and other factors insofar as they are within the scope of the appended claims or the equivalents thereof.

What is claimed is:

1. A radiator for a light emitting unit, annexed to said light emitting unit including a plurality of light emitting diodes mounted on a first principal surface of a wiring substrate, said radiator comprising:
    a radiating plate combined with said wiring substrate, the radiating plate comprising a first principal surface faced as a faying surface to a second principal surface of said wiring substrate, the second principal surface of the wiring substrate being opposite to said first principal surface of said wiring substrate, wherein the radiating plate is provided with a heat pipe fitting portion that comprises a recessed portion opened in a second principal surface of the radiating plate, the second principal surface located opposite to said first principal surface of the radiating plate; and
    a heat pipe mounted into said heat pipe fitting portion of said radiating plate while keeping close contact with an inner wall of said heat pipe fitting portion; wherein
    heat generated from said light emitting diodes is transferred to a radiating means through said radiating plate and said heat pipe.

2. The radiator for a light emitting unit as set forth in claim 1, wherein:
    said radiating plate has a structure in which said heat pipe fitting recessed portion is formed with a depth roughly equal to an outside diameter of said heat pipe, and
    said second principal surface of said radiating plate is mounted to a back panel, whereby said heat pipe fitted in said heat pipe fitting recessed portion is pressed by said back panel into close contact with said inner wall of said heat pipe fitting recessed portion.

3. The radiator for a light emitting unit as set forth in claim 1, wherein:
    said radiating plate is integrally provided with caulking projected portions at opposite opening edge portions of said heat pipe fitting recessed portion, and
    a caulking treatment of bending each said caulking projected portion inwards is conducted, whereby said heat pipe fitted in said heat pipe fitting recessed portion is pressed into close contact with said inner wall of said heat pipe fitting recessed portion.

4. The radiator for a light emitting unit as set forth in claim 1, wherein:
    said radiating means are provided in both side regions of a second principal surface of a back panel, opposed to a first principal surface of said back panel to which to mount said radiating plate, and
    a circuit unit is mounted by using as a mount surface the region between said radiating means of said second principal surface of the back panel.

5. A backlight device for supplying display light, the backlight device comprising:
    a backlight unit having a wiring substrate, and a plurality of light emitting diodes mounted on a first principal surface of said wiring substrate;
    a radiating plate which is combined with said wiring substrate to form a radiating unit, the radiating plate comprising a first principal surface faced as a faying surface to a second principal surface of said wiring substrate, the second principal surface of the wiring substrate being opposite to said first principal surface of said wiring substrate, the radiation plate provided with a heat pipe fitting portion that comprises a recessed portion opened in a second principal surface of the radiating plate, the second principal surface located opposite to said first principal surface of the radiating plate, a heat pipe mounted in said heat pipe fitting portion of said radiating plate while keeping close contact with an inner wall of said heat pipe fitting portion, and a radiating means for receiving from said radiating plate and said heat pipe heat generated from said light emitting diodes; and
    a back panel, a first principal surface of which is mounted to the second principal surface of the radiating plate.

6. The backlight device as set forth in claim 5, wherein:
    said backlight unit and said radiating unit are prepared in the form of segment bodies, and a plurality of said segment bodies are arranged in a column-row matrix form on the back surface of said display panel so as to constitute said backlight unit; and
    said heat pipe is fitted, in a penetrating manner, in said heat pipe fitting portions of the plurality of said segment bodies arranged adjacently in the column direction or the row direction.

7. The backlight device as set forth in claim 5, wherein:
    said heat pipe fitting recessed portion is formed in said second principal surface of said radiating plate, in a depth roughly equal to an outside diameter of said heat pipe; and
    said second principal surface of said radiating plate is mounted to said back panel, whereby said heat pipe fitted in said heat pipe fitting recessed portion is pressed by said back panel into close contact with the inner wall of said heat pipe fitting recessed portion.

8. The backlight device as set forth in claim 5, wherein:
    each said radiating unit is provided with said heat pipe fitting recessed portion formed by integrally providing said radiating plate with caulking projected portions faced to opening edge portions; and
    a caulking treatment of bending each said caulking projected portion inwards is conducted, whereby said heat pipe fitted in said heat pipe fitting recessed portion is pressed into close contact with the inner wall of said heat pipe fitting recessed portion.

9. The backlight device as set forth in claim 5, wherein:
    said radiating means is provided in both side regions of a second principal surface of said back panel, opposite to a first principal surface of said back panel to which said radiating unit is mounted; and
    a circuit unit is mounted by using a region, between said radiating means, of said second principal surface of said back panel as a mount surface.

10. A transmission type display apparatus comprising:
    a transmission type display panel;

a backlight device so as to supply display light to a whole area of said display panel unit from a back side, said backlight device comprising:

a backlight unit having a wiring substrate disposed opposite to a back surface of said display panel, and a plurality of light emitting diodes mounted on a first principal surface of said wiring substrate;

a radiating unit which is combined with said wiring substrate, the radiating unit comprising a first primary surface faced as a faying surface to a second principal surface of said wiring substrate, the second principal surface of the wiring substrate being opposite to said first principal surface of said wiring substrate, and which has a radiation plate provided with a heat pipe fitting portion that comprises a recessed portion opened in a second principal surface of the radiating plate, the second principal surface located opposite to said first principal surface of the radiating plate, a heat pipe mounted in said heat pipe fitting portion of said radiating plate while keeping contact with an inner wall of said heat pipe fitting portion, and a radiating means for receiving heat from said radiating plate and said heat pipe, the heat generated from said light emitting diodes; and a back panel to which said radiating plate is mounted by using a second principal surface opposite to said first principal surface as a mount surface.

11. The transmission type display apparatus as set forth in claim 10, wherein:

said backlight unit and said radiating unit are prepared in a form of segment bodies, and a plurality of said segment bodies are arranged in a column-row matrix form on the back surface of said display panel so as to constitute said backlight unit; and said heat pipe is fitted, in a penetrating manner, in said heat pipe fitting portions of said segment bodies arranged adjacently in the column direction or the row direction.

12. The transmission type display apparatus as set forth in claim 10, wherein each said radiating unit has a structure in which said radiating plate is provided with said heat pipe fitting portion, which comprises a recessed portion opened in a second principal surface opposed to said first principal surface comprising a faying surface for faying with said wiring substrate.

13. The transmission type display apparatus as set forth in claim 10, wherein:

said heat pipe fitting recessed portion is formed in said second principal surface of said radiating plate, in a depth roughly equal to an outside diameter of said heat pipe; and said second principal surface of said radiating plate is mounted to said back panel, whereby said heat pipe fitted in said heat pipe fitting recessed portion is pressed by said back panel into contact with the inner wall of said heat pipe fitting recessed portion.

14. The transmission type display apparatus as set forth in claim 10, wherein:

each said radiating unit is provided with said heat pipe fitting recessed portion formed by integrally providing said radiating plate with caulking projected portions faced to opening edge portions; and a caulking treatment of bending each said caulking projected portion inwards is conducted, whereby said heat pipe fitted in said heat pipe fitting recessed portion is pressed into contact with the inner wall of said heat pipe fitting recessed portion.

15. The transmission type display apparatus as set forth in claim 10, wherein:

said radiating means is provided in both side regions of a second principal surface, opposite to a first principal surface to which said radiating unit is mounted, of said back panel; and a circuit unit is mounted by using a region, between said radiating means, of said second principal surface as a mount surface.

* * * * *